(12) United States Patent
Park et al.

(10) Patent No.: US 11,870,008 B2
(45) Date of Patent: Jan. 9, 2024

(54) NANOROD LIGHT-EMITTING DEVICE AND METHOD OF MANUFACTURING THE SAME

(71) Applicant: SAMSUNG ELECTRONICS CO., LTD., Suwon-si (KR)

(72) Inventors: Jinjoo Park, Yongin-si (KR); Junhee Choi, Seongnam-si (KR); Nakhyun Kim, Yongin-si (KR); Dongho Kim, Seoul (KR); Joohun Han, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 108 days.

(21) Appl. No.: 17/227,538

(22) Filed: Apr. 12, 2021

(65) Prior Publication Data
US 2022/0069161 A1    Mar. 3, 2022

(30) Foreign Application Priority Data

Aug. 31, 2020  (KR) .......................... 10-2020-0110599

(51) Int. Cl.
*H01L 33/14* (2010.01)
*H01L 33/04* (2010.01)
(Continued)

(52) U.S. Cl.
CPC .......... *H01L 33/145* (2013.01); *H01L 27/156* (2013.01); *H01L 33/005* (2013.01); *H01L 33/04* (2013.01); *H01L 33/56* (2013.01)

(58) Field of Classification Search
CPC . H01L 25/0753; H01L 25/167; H01L 27/156; H01L 2933/0025; H01L 33/005;
(Continued)

(56) References Cited

U.S. PATENT DOCUMENTS

2006/0065901 A1    3/2006  Aoyagi et al.
2011/0263054 A1*  10/2011  Yu ........................ H01L 33/145
                                                            438/34
(Continued)

FOREIGN PATENT DOCUMENTS

KR    1020110086982 A    8/2011
KR    1020190054461 A    5/2019
KR    1020200029100 A    3/2020

*Primary Examiner* — Matthew C Landau
*Assistant Examiner* — Dmitriy Yemelyanov
(74) *Attorney, Agent, or Firm* — Sughrue Mion, PLLC

(57) ABSTRACT

A nanorod light-emitting device is provided. The nanorod light-emitting device includes a first semiconductor layer, a light-emitting layer on the first semiconductor layer, a second semiconductor layer disposed on the light-emitting layer, at least one conductive layer disposed between a central portion of a lower surface of the light-emitting layer and the first semiconductor layer, or between a central portion of an upper surface of the light-emitting layer and the second semiconductor layer, at least one current blocking layer that surrounds a side surface of the at least one conductive layer, and an insulating film that surrounds a side surface of the second semiconductor layer, a side surface of the light-emitting layer, and a side surface of the at least one current blocking layer.

22 Claims, 16 Drawing Sheets

(51) Int. Cl.
*H01L 33/00* (2010.01)
*H01L 27/15* (2006.01)
*H01L 33/56* (2010.01)

(58) Field of Classification Search
CPC ..... H01L 33/007; H01L 33/04; H01L 33/145; H01L 33/20; H01L 33/44; H01L 33/56
See application file for complete search history.

(56) References Cited

U.S. PATENT DOCUMENTS

| | | | |
|---|---|---|---|
| 2015/0187991 A1* | 7/2015 | McGroddy | H01L 24/95 |
| | | | 257/13 |
| 2015/0349200 A1* | 12/2015 | Chen | H01L 33/38 |
| | | | 257/98 |
| 2017/0138549 A1* | 5/2017 | Do | F21K 9/64 |
| 2017/0317228 A1* | 11/2017 | Sung | H01L 33/24 |
| 2018/0233533 A1* | 8/2018 | Kondo | H01S 5/18361 |
| 2021/0399173 A1 | 12/2021 | Choi et al. | |

* cited by examiner

NANOROD LIGHT-EMITTING DEVICE AND METHOD OF MANUFACTURING THE SAME

CROSS-REFERENCE TO THE RELATED APPLICATION

This application is based on and claims priority under 35 U.S.C. § 119 to Korean Patent Application No. 10-2020-0110599, filed on Aug. 31, 2020, in the Korean Intellectual Property Office, the disclosure of which is incorporated by reference herein in its entirety.

BACKGROUND

1. Field

Embodiments of the present disclosure relate to nanorod light-emitting devices and methods of manufacturing the same. Also, embodiments of the present disclosure relate to display devices including a nanorod light-emitting device.

2. Description of Related Art

A light-emitting diode (LED) is known as a next-generation light source having advantages, such as long lifespan, low power consumption, high response speed, and environmental friendliness compared to a conventional light source, and due to these advantages, industrial demand is increasing. An LED is generally applied to and used in various products, such as illumination devices and backlights of display devices.

Recently, a micro LED of micro-units or nano-units using a Group II-VI or Group III-V compound semiconductor has been developed. Also, a micro LED display to which the micro LED is directly applied as a light-emitting element of display pixels is being developed.

When an LED of micro-units or nano-units as described above is used, surface defects may occur during a manufacturing process of the micro LED of micro-units or nano-units. The surface defects may cause a decrease in luminous efficiency of the LED.

SUMMARY

Provided are nanorod light-emitting devices having a centralized current path structure in which a current flows in central portions of nanorods to prevent a current from flowing to sides of the nanorods and to prevent a problem due to surface defects of the nanorods, and methods of manufacturing the same.

Provided are display devices including the nanorod light-emitting devices described above.

Additional aspects will be set forth in part in the description which follows and, in part, will be apparent from the description, or may be learned by practice of the presented embodiments of the disclosure.

According to one or more embodiments, a nanorod light-emitting device is provided. The nanorod light-emitting device includes: a first semiconductor layer doped with a first conductivity type; a light-emitting layer on the first semiconductor layer; a second semiconductor layer disposed on the light-emitting layer and doped with a second conductivity type that is electrically opposite to the first conductivity type; at least one conductive layer disposed between a central portion of a lower surface of the light-emitting layer and the first semiconductor layer, or between a central portion of an upper surface of the light-emitting layer and the second semiconductor layer; at least one current blocking layer that surrounds a side surface of the at least one conductive layer; and an insulating film that surrounds a side surface of the second semiconductor layer, a side surface of the light-emitting layer, and a side surface of the at least one current blocking layer.

According to an embodiment, the insulating film includes implanted heavy ions.

According to an embodiment, the implanted heavy ions include one or more from among Ar, As, Kr, and Xe.

According to an embodiment, the insulating film extends to the first semiconductor layer and surrounds a side surface of the first semiconductor layer.

According to an embodiment, the first semiconductor layer is a single layer including a semiconductor material of a single composition.

According to an embodiment, the second semiconductor layer is a single layer including a semiconductor material having a same composition as the semiconductor material of the first semiconductor layer.

According to an embodiment, the at least one current blocking layer includes an oxide material.

According to an embodiment, the at least one conductive layer is a plurality of conductive layers that include a first conductive layer between the central portion of the lower surface of the light-emitting layer and the first semiconductor layer, and a second conductive layer between the central portion of the upper surface of the light-emitting layer and the second semiconductor layer.

According to an embodiment, the at least one current blocking layer is a plurality of current blocking layers that include a first current blocking layer that surrounds a side of the first conductive layer, and a second current blocking layer that surrounds a side of the second conductive layer.

According to an embodiment, the insulating film extends to an upper surface of the first current blocking layer such as to surround the side surface of the second semiconductor layer, the side surface of the second current blocking layer, and the side surface of the light-emitting layer.

According to an embodiment, the plurality of conductive layers further includes a third conductive layer disposed in the light-emitting layer at a central portion of the light-emitting layer, and the plurality of current blocking layers further includes a third current blocking layer that surrounds a side surface of the third conductive layer in the light-emitting layer.

According to an embodiment, the light-emitting layer includes a first quantum well structure and a second quantum well structure, and the third conductive layer is disposed at the central portion, between the first quantum well structure and the second quantum well structure, and the third current blocking layer is disposed at an edge between the first quantum well structure and the second quantum well structure.

According to an embodiment, the nanorod light-emitting device further includes a contact layer disposed on an upper surface of the second semiconductor layer.

According to an embodiment, the insulating film has an outer diameter in a range of 0.05 μm to 2 μm.

According to an embodiment, each of the at least one conductive layer has a diameter of 0.01 μm or more and is less than the outer diameter of the insulating film.

According to an embodiment, the nanorod light-emitting device has a height in a range of 1 μm to 20 μm.

According to an embodiment, each of the at least one current blocking layer and the at least one conductive layer have a same thickness.

According to an embodiment, each of the at least one current blocking layer has a thickness in a range of 5 nm to 200 nm.

According to an embodiment, the at least one conductive layer includes $Al_xGa_{1-x}As$ (x≥0.85), the at least one current blocking layer includes AlOx, and the first semiconductor layer and the second semiconductor layer include AlGaInP.

According to an embodiment, the nanorod light-emitting device further includes a passivation film surrounding a side surface of the insulating film and a side surface of the first semiconductor layer.

According to an embodiment, the passivation film includes at least one material selected from AlOx, HfOx, TiOx, SiNx, SiOx, and $Al_xGa_{1-x}As$ (x≥0.9).

According to one or more embodiments, a display device is provided. The display device includes: a plurality of pixel electrodes; a common electrode corresponding to the plurality of pixel electrodes; and a plurality of nanorod light-emitting devices connected between each of the pixel electrodes and the common electrode.

According to one or more embodiments, a method of manufacturing a nanorod light-emitting device is provided. The method includes: forming a sacrificial layer on a semiconductor substrate; forming a first semiconductor layer doped with a first conductivity type on the sacrificial layer; forming a light-emitting layer on the first semiconductor layer; forming, on the light-emitting layer, a second semiconductor layer doped with a second conductivity type that is electrically opposite to the first conductivity type; forming a conductive layer material on the first semiconductor layer between the forming of the first semiconductor layer and the forming of the light-emitting layer, or forming a conductive layer on the light-emitting layer between the forming of the light-emitting layer and the forming of the second semiconductor layer; forming a plurality of nanorod light-emitting devices by partially etching the first semiconductor layer, the light-emitting layer, the second semiconductor layer, and the conductive layer; forming an insulating film by implanting ions into a side surface of the second semiconductor layer, a side surface of the light-emitting layer, and a side surface of the conductive layer; and forming a current blocking layer that surrounds the side surface of the conductive layer by oxidizing the side surface of the conductive layer through an oxidation process.

According to an embodiment, the ions include at least one from among Ar, As, Kr, and Xe.

According to an embodiment, the implanting the ions includes implanting the ions to a side of the first semiconductor layer.

According to an embodiment, the method further includes forming a passivation film surrounding a side surface of the insulating film and a side surface of the first semiconductor layer.

According to an embodiment, the passivation film includes at least one material selected from AlOx, HfOx, SiNx, SiOx, and $Al_xGa_{1-x}As$ (x≥0.9).

According to an embodiment, the method further includes separating the plurality of nanorod light-emitting devices by removing the sacrificial layer.

According to one or more embodiments, a method of manufacturing a nanorod light-emitting device is provided. The method includes: forming a sacrificial layer on a semiconductor substrate; forming, on the sacrificial layer, a first semiconductor layer doped with a first conductivity type; forming a light-emitting layer on the first semiconductor layer; forming, on the light-emitting layer, a second semiconductor layer doped with a second conductivity type that is electrically opposite to the first conductivity type; forming a conductive layer material on the first semiconductor layer between the forming of the first semiconductor layer and the forming of the light-emitting layer, or forming a conductive layer on the light-emitting layer between the forming of the light-emitting layer and the forming of the second semiconductor layer; forming an insulating film by implanting ions into a region of the second semiconductor layer, a region of the light-emitting layer, and a region of the conductive layer; forming a plurality of nanorod light-emitting devices by etching the first semiconductor layer, the light-emitting layer, the second semiconductor layer, the conductive layer, and the insulating film; and forming a current blocking layer that surrounds a side surface of the conductive layer by oxidizing the side surface of the conductive layer through an oxidation process.

According to an embodiment, the ions include at least one from among Ar, As, Kr, and Xe.

According to an embodiment, the implanting the ions includes implanting the ions to a side of the first semiconductor layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
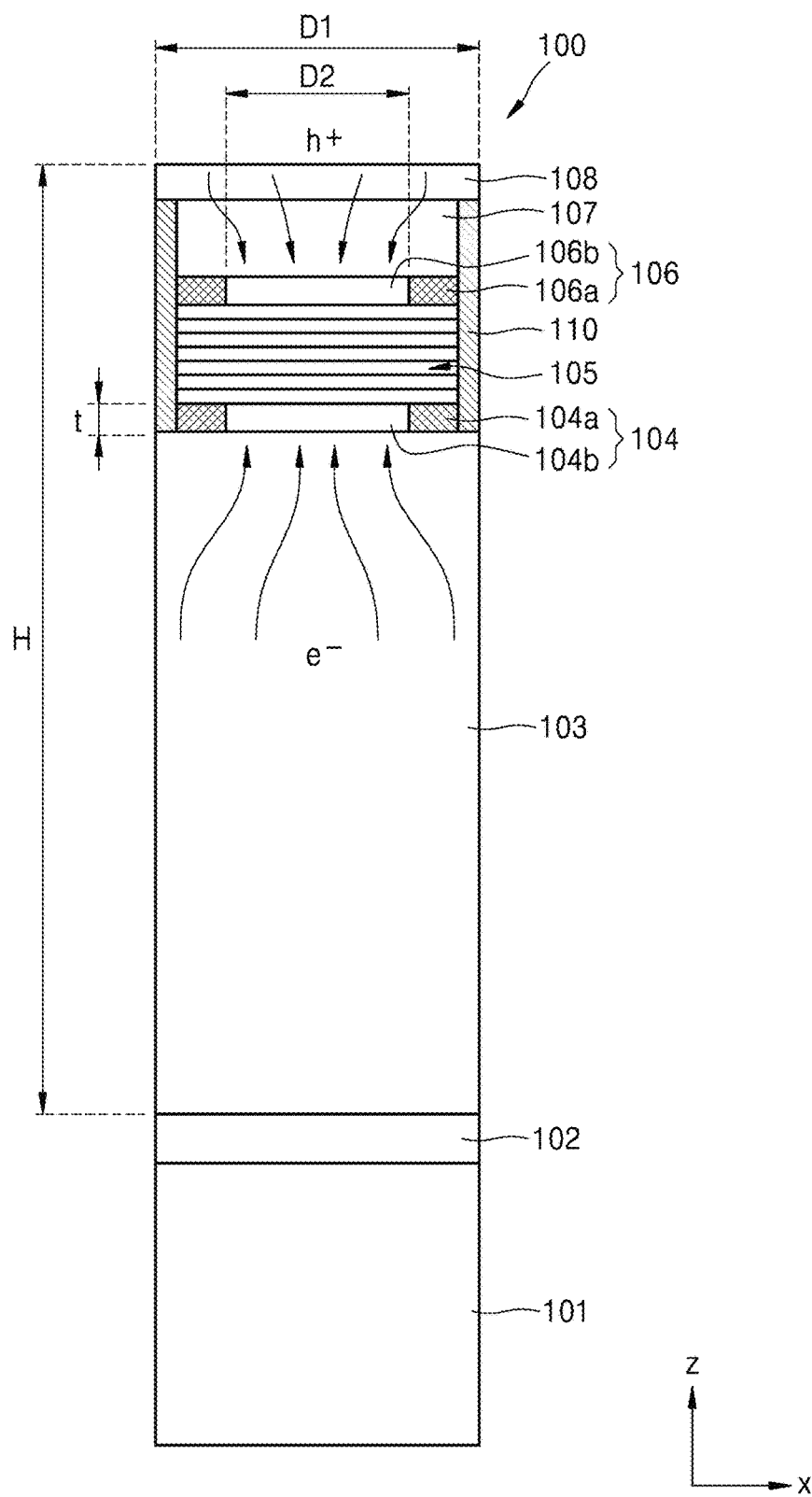
FIG. 1 is a cross-sectional view showing a schematic configuration of a nanorod light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a nanorod light-emitting device having a centralized current path structure and a method of manufacturing the same will be described in detail with reference to the accompanying drawings. In the drawings, sizes of elements in the drawings may be exaggerated for convenience of explanation. The embodiments of the present disclosure are capable of various modifications and may be embodied in many different forms.

It will be understood that when an element or layer is referred to as being "on" or "above" another element or layer, the element or layer may be directly on another element or layer or intervening elements or layers. As used herein, the singular forms "a," "an" and "the" are intended to include the plural forms as well, unless the context clearly indicates otherwise. It should be understood that, when a part "comprises" or "includes" an element in the specification, unless otherwise defined, it is not excluding other elements but may further include other elements.

With respect to operations that constitute a method, the operations may be performed in any appropriate sequence unless the sequence of operations is clearly described or unless the context clearly indicates otherwise.

Also, in the specification, the term "units" or "modules" denote units or modules that process at least one function or operation, and may be realized by hardware, software, or a combination of hardware and software.

In addition, connections or connection members of lines between components shown in the drawings illustrate functional connections and/or physical or circuit connections, and the connections or connection members may be represented by replaceable or additional various functional connections, physical connections, or circuit connections in an actual apparatus.

All examples or example terms are simply used to explain in detail the technical scope of present disclosure, and thus, the scope of the present disclosure is not limited by the examples or the example terms.

FIG. 1 is a cross-sectional view showing a schematic configuration of a nanorod light-emitting device 100 according to an embodiment. Referring to FIG. 1, the nanorod light-emitting device 100 according to an embodiment includes a first semiconductor layer 103, a first current path layer 104, a light-emitting layer 105 on the first semiconductor layer 103, a second current path layer 106, a second semiconductor layer 107 on the light-emitting layer 105, a contact layer 108, and an insulating film 110.

The nanorod light-emitting device 100 according to an embodiment may have a nanorod shape having a very small size of a nano size or a micro size. For example, the nanorod light-emitting device 100 may have an outer diameter D1 in a range from about 0.05 μm to about 2 μm. The nanorod light-emitting device 100 having a nanorod shape may have a generally uniform outer diameter in a length direction. Also, when a distance between a lower surface of the first semiconductor layer 103 and an upper surface of the second semiconductor layer 107 or a distance between the lower surface of the first semiconductor layer 103 and an upper surface of the contact layer 108 is referred to as a height H of the nanorod light-emitting device 100, the height H of the nanorod light-emitting device 100 may be in a range from about 1 μm to about 20 μm. Accordingly, the nanorod light-emitting device 100 may have a large aspect ratio of, for example, 5 or more. In general, the outer diameter D1 of the nanorod light-emitting device 100 may be selected to be about 600 nm and the height H may be selected to be about 5 μm. In this case, the aspect ratio of the nanorod light-emitting device 100 is slightly greater than 8.

However, when the nanorod light-emitting device 100 having a large aspect ratio with a small size is manufactured, a surface to volume ratio increases and surface defects of the light-emitting layer 105 increases. In other words, surface defects due to dangling bonds occur on an outer surface of the light-emitting layer 105. As the surface-to-volume ratio increases, the dangling bonds also increase, and accordingly, the surface defects increase. The surface defects may interfere with the flow of current and is a factor of reducing the luminous efficiency of a light-emitting layer.

In the nanorod light-emitting device 100 having a relatively large aspect ratio, in order to prevent the luminous efficiency of the light-emitting layer 105 from reducing, it is possible to prevent current from flowing near a surface of the light-emitting layer 105 on which surface defects exist. The first current blocking layer 104a and the second current blocking layer 106a that control a current flow path so that a current is supplied only to a central portion of the light-emitting layer 105 having almost no surface defects and an insulating film 110 that prevents a current from flowing to a side of the light-emitting layer 105 may be disposed. Hereinafter, a specific configuration of the nanorod light-emitting device 100, The first current blocking layer 104a and the second current blocking layer 106a that control a current flow path to prevent surface defects, and the insulating film 110 capable of preventing a current from flowing to a side of the light-emitting layer 105 will be described in detail.

The first semiconductor layer 103 according to an embodiment may be disposed on a substrate 101, and a buffer layer or a sacrificial layer 102 may further be disposed between the substrate 101 and the first semiconductor layer 103. For example, the sacrificial layer 102 may be disposed on the substrate 101 and the first semiconductor layer 103 may be disposed on the sacrificial layer 102. The substrate 101 may include a Group II-VI or Group III-V compound semiconductor material. For example, the substrate 101 may include GaAs. The nanorod light-emitting device 100 may be used in a state including the substrate 101 and the sacrificial layer 102, or used in a state that the substrate 101 and the sacrificial layer 102 are removed after the nanorod light-emitting device 100 is manufactured.

The first semiconductor layer 103 and the second semiconductor layer 107 may include a Group II-VI or Group III-V compound semiconductor material. The first semiconductor layer 103 and the second semiconductor layer 107 may provide electrons and holes to the light-emitting layer 105. To this end, the first semiconductor layer 103 may be doped with an n-type or p-type, and the second semiconductor layer 107 may be doped with a conductivity type that is electrically opposite to the first semiconductor layer 103. For example, the first semiconductor layer 103 may be doped with an n-type and the second semiconductor layer 107 may be doped with a p-type or the first semiconductor layer 103 may be doped with a p-type and the second semiconductor layer 107 may be doped with an n-type. When the first semiconductor layer 103 or the second semiconductor layer 107 is doped with an n-type, for example, silicon (Si) may be used as a dopant, and in the case of doping with a p-type, for example, zinc (Zn) may be used as a dopant. The first semiconductor layer 103 or the second semiconductor layer 107 doped with an n-type may provide electrons to the light-emitting layer 105, and the second semiconductor layer 107 or first semiconductor layer 103 doped with a p-type may provide holes to the light-emitting layer 105.

The substrate 101 and the sacrificial layer 102 may be doped with the same conductivity type as the first semiconductor layer 103 thereon. For example, when the first semiconductor layer 103 is doped with an n-type, the substrate 101 and the sacrificial layer 102 may include n-GaAs. The substrate 101 may be doped with a lower concentration than the sacrificial layer 102, and the sacrificial layer 102 may be doped with a higher concentration than the substrate 101. Although not shown in FIG. 1, a contact layer for ohmic contact may further be disposed between the first semiconductor layer 103 and the sacrificial layer 102. The contact layer disposed between the first semiconductor layer 103 and the sacrificial layer 102 may also be doped with the same conductivity type as the first semiconductor layer 103 at a doping concentration greater than that of the first semiconductor layer 103 and the sacrificial layer 102.

The light-emitting layer 105 has a structure in which a quantum well is disposed between barriers. Light may be generated when electrons and holes provided from the first semiconductor layer 103 and the second semiconductor layer 107 are recombined in the quantum well in the light-emitting layer 105. A wavelength of light generated in the light-emitting layer 105 may be determined according to a band gap of a material constituting the quantum well in the light-emitting layer 105. The light-emitting layer 105 may have only one quantum well, or may have a multi-quantum well (MQW) structure in which a plurality of quantum wells and a plurality of barriers are alternately disposed. The thickness of the light-emitting layer 105 or the number of quantum wells in the light-emitting layer 105 may be appropriately selected in consideration of a driving voltage and luminous efficiency of the nanorod light-emitting device 100, etc. For example, the thickness of the light-emitting layer 105 may be selected to be twice or less than the outer diameter D1 of the nanorod light-emitting device 100.

Also, the nanorod light-emitting device 100 may further include a contact layer 108 on the second semiconductor layer 107 to provide an ohmic contact. The contact layer 108 may be doped with the same conductivity type as the second semiconductor layer 107. For example, when the second semiconductor layer 107 is doped with a p-type, the contact layer 108 may also be doped with a p-type. The contact layer 108 may include, for example, GaInP or GaAs.

The first current path layer 104 and the second current path layer 106 disposed respectively on lower and upper surfaces of the light-emitting layer 105 concentrate current to a central portion of the light-emitting layer 105 having almost no surface defects, thereby increasing luminous efficiency of the light-emitting layer 105. To this end, the first current path layer 104 may include a first current blocking layer 104a disposed between an edge of a lower surface of the light-emitting layer 105 and an edge of an upper surface of the first semiconductor layer 103 and a first conductive layer 104b disposed between a central portion of the lower surface of the light-emitting layer 105 and a central portion of the upper surface of the first semiconductor layer 103. Accordingly, the first current blocking layer 104a has a ring shape surrounding a side surface of the first conductive layer 104b on the same layer as the first conductive layer 104b. In addition, the second current path layer 106 may include a second current blocking layer 106a disposed between an edge of an upper surface of the light-emitting layer 105 and an edge of a lower surface of the second semiconductor layer 107 and a second conductive layer 106b disposed between a central portion of the upper surface of the light-emitting layer 105 and a central portion of the lower surface of the second semiconductor layer 107. The second current blocking layer 106a has a ring shape surrounding a side surface of the second conductive layer 106b on the same layer as the second conductive layer 106b.

As an example, the first conductive layer 104b and the second conductive layer 106b may have a diameter D2 of 0.01 µm or more. In this case, the outer diameter D1 of the nanorod light-emitting device 100 may be the same as the outer diameter D1 of the insulating film 110, and the diameters D2 of the first conductive layer 104b and the second conductive layer 106b may be less than the outer diameter D1 of the insulating film 110. Also, the thickness t of the first current blocking layer 104a and the thickness of the first conductive layer 104b may be the same, and the thickness of the second current blocking layer 106a and the second conductive layer 106b may be the same. For example, the thickness t of the first current blocking layer 104a and the thickness of the second current blocking layer 106a may be in a range from about 5 nm to about 200 nm.

In FIG. 1, the first current path layer 104 and the second current path layer 106 are shown to be disposed on both the lower and upper surfaces of the light-emitting layer 105, but are not limited thereto. For example, the nanorod light-emitting device 100 may include only one from among the first current path layer 104 disposed on the lower surface of the light-emitting layer 105 and the second current path layer 106 disposed on the upper surface of the light-emitting layer 105.

The insulating film 110 according to an embodiment may be arranged to surround side surfaces of the second semiconductor layer 107, the light-emitting layer 105, the first current blocking layer 104a, and the second current blocking layer 106a. As described above, surface defects may occur on side surfaces of the light-emitting layer 105. When a current spreads along a side surface of the light-emitting layer 105 where surface defects have occurred, the luminous efficiency of the light-emitting layer 105 may decrease. To prevent the spreading of current that may be generated along the side of the light-emitting layer 105, the insulating film 110 may be arranged to surround side surfaces of the second semiconductor layer 107, the light-emitting layer 105, the first current blocking layer 104a, and the second current blocking layer 106a. Accordingly, the insulating film 110 may have a ring shape surrounding the side surfaces of the second semiconductor layer 107, the light-emitting layer 105, the first current blocking layer 104a, and the second current blocking layer 106a. According to the present embodiment, the insulating film 110 may have an outer diameter D1 in a range of about 0.05 μm to about 2 μm.

However, embodiments of the present disclosure are not limited thereto, and the insulating film 110 may extend to the first semiconductor layer 103 in a length direction (Z direction) of the nanorod light-emitting device 100. In this case, the insulating film 110 may have a ring shape surrounding the side surfaces of the second semiconductor layer 107, the light-emitting layer 105, the first current blocking layer 104a, the second current blocking layer 106a, and the first semiconductor layer 103. Also, the insulating film 110 may extend to the first current blocking layer 104a in the length direction (Z direction) of the nanorod light-emitting device 100. In this case, the insulating film 110 may have a ring shape surrounding the side surfaces of the second semiconductor layer 107, the light-emitting layer 105, and the second current blocking layer 106a.

Also, the insulating film 110 according to an embodiment may include one or more heavy ions implanted using an ion implantation process. For example, the insulating film 110 may include one or more of Ar, As, Kr, and Xe. Ions implanted by using an ion implantation process may extend in a width direction (X direction) perpendicular to the length direction (Z direction) by a collision cascade. In the case of heavy ions, the heavy ions may prevent a phenomenon in which the insulating film 110 randomly extends in a width direction (X direction). In this way, a phenomenon of excessively blocking of a light-emitting region of the light-emitting layer 105 by the insulating film 110 may be prevented, and thus, the luminous efficiency of the nanorod light-emitting device 100 may be improved.

As described above, the insulating film 110 may be disposed in order to prevent a current from spreading along defective side surfaces of the light-emitting layer 105. However, a insulating film may excessively block the light-emitting region of a light-emitting layer, and thus, luminous efficiency may decrease. The insulating film 110 may be formed by applying an ion implantation process at a level of preventing excessive blocking of the emission region of the light-emitting layer 105. Hereinafter, a method of manufacturing the nanorod light-emitting device 100 in which an insulating film is formed by using an ion implantation process will be described.

FIGS. 2A to 2F are cross-sectional views schematically showing a method of manufacturing a nanorod light-emitting device 100 according to an embodiment. FIGS. 3A and 3B are diagrams schematically illustrating a process of transferring implanted ions according to an embodiment. Hereinafter, a method of manufacturing the nanorod light-emitting device 100 according to an embodiment will be described with reference to FIGS. 2A to 2F.

Figure 2A:
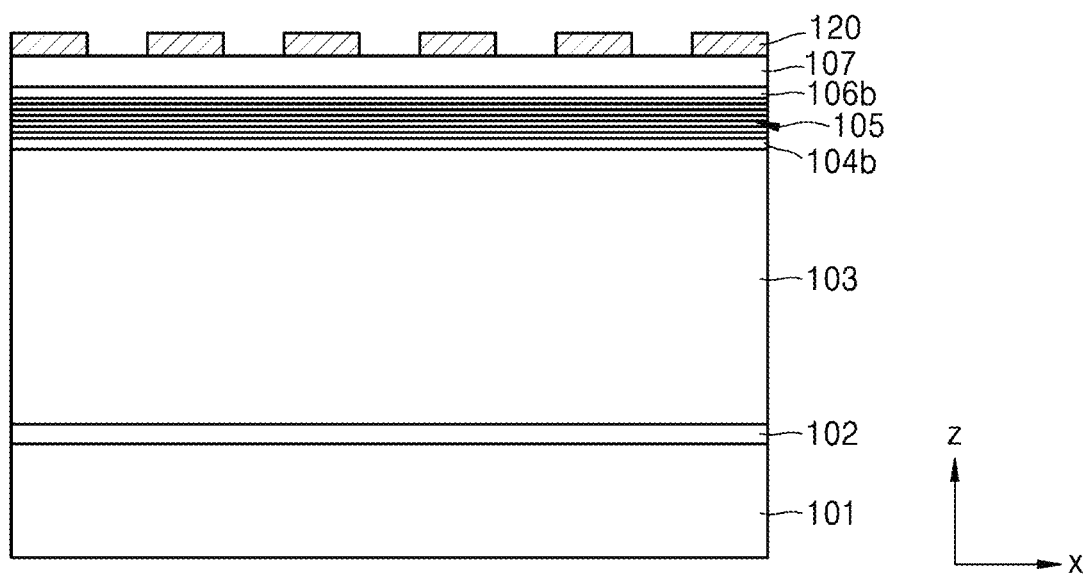
FIG. 2A is a first cross sectional view schematically showing a method of manufacturing a nanorod light-emitting device according to an embodiment.

First, referring to FIG. 2A, the sacrificial layer 102, the first semiconductor layer 103, the first conductive layer 104b, the light-emitting layer 105, the second conductive layer 106b, and the second semiconductor layer 107 are sequentially grown on the substrate 101. The sacrificial layer 102 is disposed over a large area of an upper surface of the substrate 101, the first semiconductor layer 103 is grown on an entire upper surface of the sacrificial layer 102, and the first conductive layer 104b is grown over an entire upper surface of the first semiconductor layer 103. Also, each of the light-emitting layer 105, the second conductive layer 106b, and the second semiconductor layer 107 may be grown to be disposed over an entire upper surface of a layer therebelow. Although not shown in FIGS. 2A to 2E, the contact layer 108 may further be formed on the upper surface of the second semiconductor layer 107.

The substrate 101 and the sacrificial layer 102 may include, for example, n-GaAs. When the nanorod light-emitting device 100 is a light-emitting device that generates red light, the first semiconductor layer 103 may include, for example, n-AlGaInP, and the second semiconductor layer 107 may include p-AlGaInP. Accordingly, the first semiconductor layer 103 is a single layer including a semiconductor material having a single composition and the second semiconductor layer 107 is also a single layer including the same semiconductor material as the first semiconductor layer 103, wherein the first semiconductor layer 103 and the second semiconductor layer 107 are doped in opposite types. For example, the first semiconductor layer 103 may be doped with Si and the second semiconductor layer 107 may be doped with Zn. Also, when the contact layer 108 is further formed, the contact layer 108 may include, for example, p-GaInP or p-GaAs, or may include both p-GaInP and p-GaAs.

In the case when the light-emitting layer 105 generates red light, the light-emitting layer 105 may include, for example, AlGaInP. AlGaInP of the light-emitting layer 105 is not doped. The light-emitting layer 105 includes a barrier and a quantum well, and to this end, the content of Al in AlGaInP may vary. For example, the content of Al in AlGaInP in a barrier is greater than in a quantum well. Also, when compared to the first semiconductor layer 103 and the second semiconductor layer 107, the Al content in the first semiconductor layer 103 and the second semiconductor layer 107 is the greatest, followed by the Al content in a barrier in the light-emitting layer 105, and the Al content in the quantum well in the light-emitting layer 105 is the least. Then, the energy level of the first semiconductor layer 103 and the second semiconductor layer 107 is the greatest in a conduction band, the energy level of the barrier in the light-emitting layer 105 is the next greatest, and the energy of the quantum well in the light-emitting layer 105 is the lowest.

After the second semiconductor layer 107 is formed, a hard mask 120 is formed on the second semiconductor layer 107 at regular intervals. Alternatively, when the contact layer 108 is formed on the second semiconductor layer 107, a hard mask 120 having a plurality of openings arranged at regular intervals may be formed on the contact layer 108.

For example, after a material for forming the hard mask 120 is entirely formed on the upper surface of the second semiconductor layer 107 or the contact layer 108, the hard mask 120 may be formed by patterning the material for forming the hard mask 120 to have a plurality of openings arranged at regular intervals by using a lithography method. The hard mask 120 may include, for example, a $SiO_2$ single layer or a $SiO_2$/Al double layer. Although not specified in the cross-sectional view of FIG. 2A, when viewed from above, the hard mask 120 may have a plurality of two-dimensionally arranged openings.

Figure 2B:
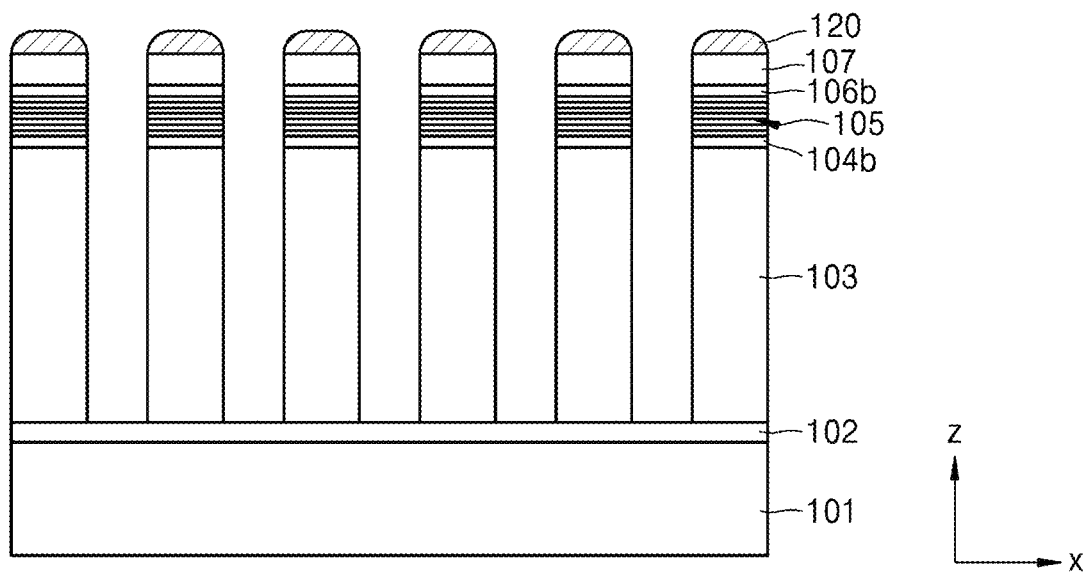
FIG. 2B is a second cross sectional view schematically showing the method of manufacturing the nanorod light-emitting device according to the embodiment.
Figure 3A:
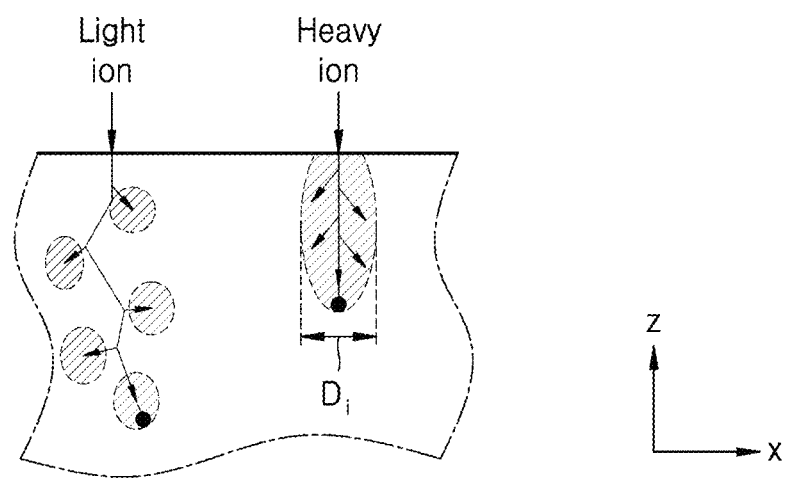
FIG. 3A is a first diagram schematically illustrating a process of transferring implanted ions according to an embodiment.
Figure 3B:
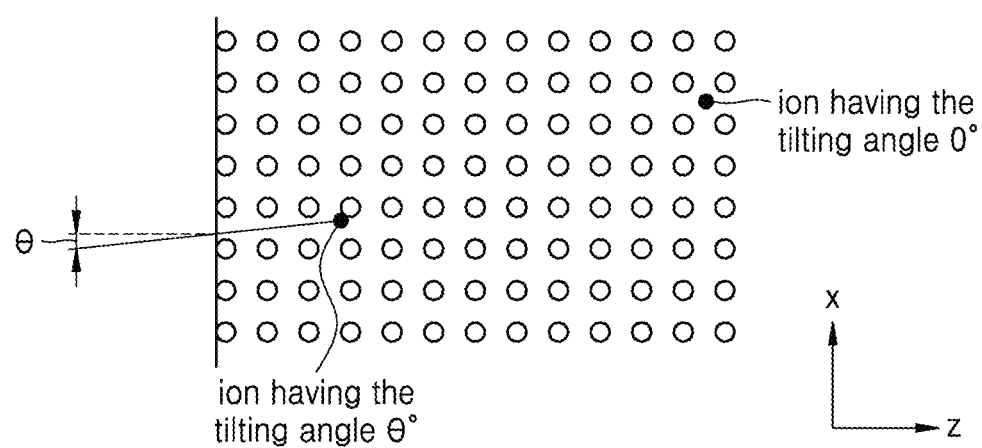
FIG. 3B is a second diagram schematically illustrating the process of transferring implanted ions according to the embodiment.

Referring to FIG. 2B, regions not covered by the hard mask 120 may be removed by using a dry etching method. For example, the regions not covered by the hard mask 120 may be removed by sequentially etching the second semiconductor layer 107, the second conductive layer 106b, the light-emitting layer 105, the first conductive layer 104b, and the first semiconductor layer 103 under the openings of the hard mask 120 until the sacrificial layer 102 is exposed. Then, as shown in FIG. 2B, a plurality of nanorods each including the first semiconductor layer 103, the first conductive layer 104b, the light-emitting layer 105, the second conductive layer 106b, and the second semiconductor layer 107 may be formed on the substrate 101 and the sacrificial layer 102.

As an example, an edge portion of the hard mask 120 may also be partially removed, and thus, may be formed to a round shape. Also, in the process of etching by using a dry etching method, an etch slope may be less than 90 degrees. Accordingly, an ion implantation process may be performed by using the same hard mask 120.

Figure 2C:
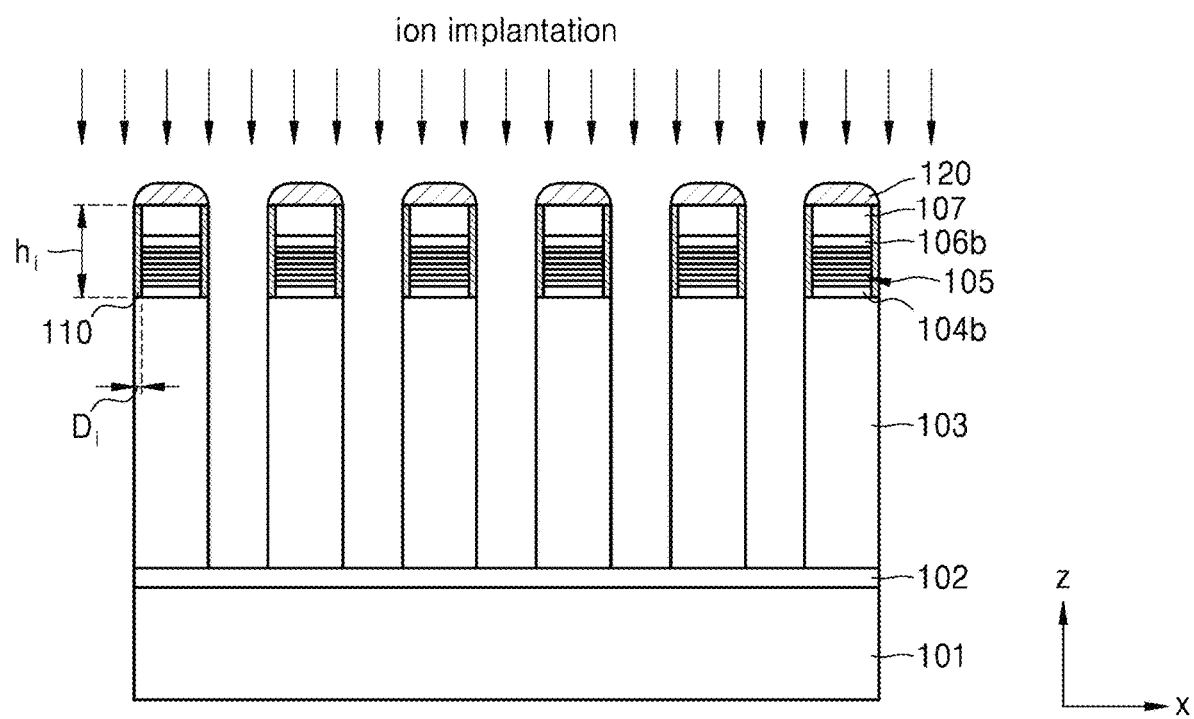
FIG. 2C is a third cross sectional view schematically showing the method of manufacturing the nanorod light-emitting device according to the embodiment.

Referring to FIG. 2C, the insulating film 110 may be generated by implanting heavy ions into side surfaces of the second semiconductor layer 107, the light-emitting layer 105, and the first conductive layer 104b and the second conductive layer 106b by using an ion implantation method. The ion implant method is a method of directly implanting ions into the side surfaces of the second semiconductor layer 107, the light-emitting layer 105, and the first conductive layer 104b and the second conductive layer 106b in order to secure predetermined electrical characteristics, for example, insulating characteristics. In this case, the depth and width of the ion implantation may be determined according to the type of ion, the ion implantation tilting angle, the acceleration energy, and the number of implanted ions per unit area (dose).

As an example, a width $D_i$ of the insulating film 110 may be formed as small as possible so as not to block an emission region of the light-emitting layer 105. Accordingly, as shown in FIG. 3A, when a collision cascade occurs during an ion implantation process, the width of the insulating film 110 to which ions are implanted may be readily controlled by controlling ion implantation conditions. For example, when the ions included in the insulating film 110 are heavy ions, the width of the ion implantation may be prevented from being extended at random. Accordingly, the ions implanted in the ion implantation process may include one or more of heavy ions, for example, Ar, As, Kr, and Xe.

Figure 6:
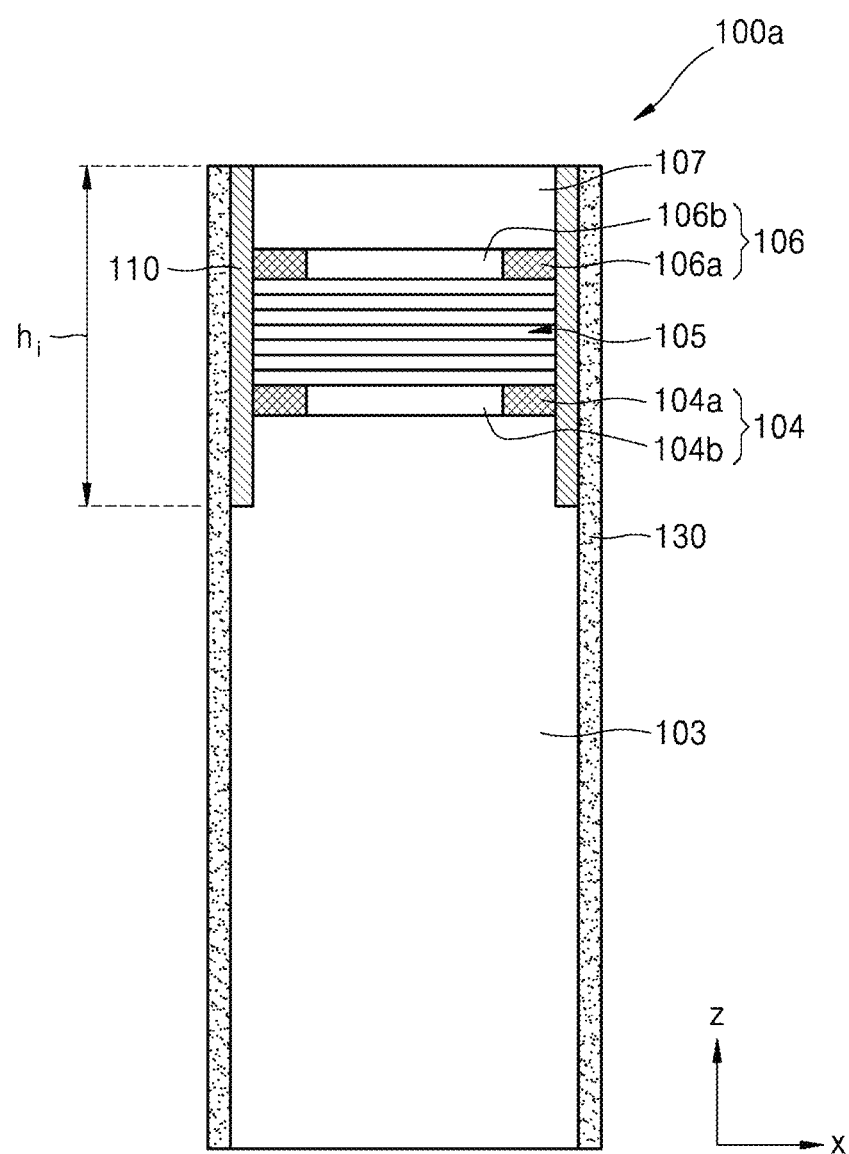
FIG. 6 is a cross-sectional view showing a schematic configuration of a nanorod light-emitting device according to another embodiment.

Also, a length $h_i$ of the insulating film 110 to be extended may be extended to the first semiconductor layer 103 as shown in FIG. 6 to be described later. Accordingly, as shown in FIG. 3B, if atoms constituting an object into which ions are implanted have a regular matrix structure, the smaller the tilting angle θ at which ions are implanted, the deeper the ions in a length direction (Z direction). As an example, when objects to which the ion implant process is performed are the second semiconductor layer 107, the light-emitting layer 105, and the first conductive layer 104b and the second conductive layer 106b, a tilting angle θ at which ions are implanted in the ion implant process may be approximately 0 degrees.

Also, the length $h_i$ and the width $D_i$ of the insulating film 110 to be extended may be controlled according to the acceleration energy applied to the implanted ions and the number of implanted ions per unit area (dose). As an example, the length $h_i$ of the insulating film 110 to be extended may be extended to at least the lowermost surface of the light-emitting layer 105. The width $D_i$ of the insulating film 110 to be extended may be extended within a minimum range so as not to block the light-emitting region of the light-emitting layer 105. Accordingly, the acceleration energy applied to the implanted ions and the number of implanted ions per unit area (dose) may be determined according to the length $h_i$ and the width $D_i$ of the extension of the insulating film 110.

Figure 2D:
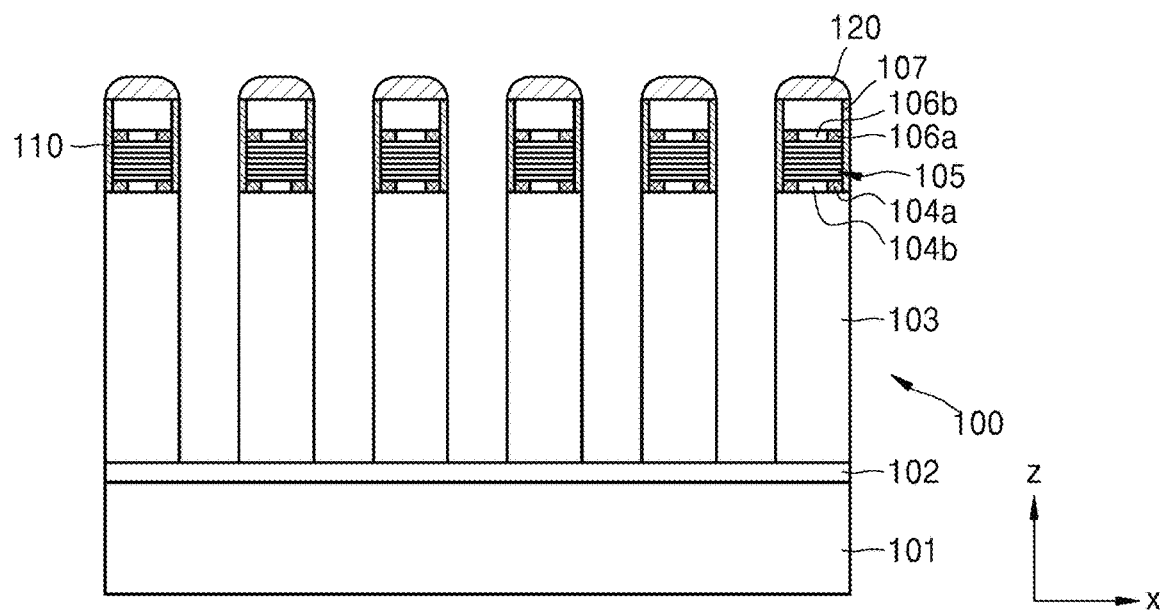
FIG. 2D is a fourth cross sectional view schematically showing the method of manufacturing the nanorod light-emitting device according to the embodiment.

Next, referring to FIG. 2D, the first current blocking layer 104a surrounding a side surface of the first conductive layer 104b and the second current blocking layer 106a surrounding a side surface of the second conductive layer 106b may be formed by oxidizing the side surfaces of the first conductive layer 104b and the second conductive layer 106b. To this end, the first conductive layer 104b and the second conductive layer 106b may include a semiconductor material that has a similar crystal structure to that of the first semiconductor layer 103 and the second semiconductor layer 107 and the light-emitting layer 105 and is easily oxidized. For example, the first conductive layer 104b and the second conductive layer 106b may include a material including $Al_xGa_{1-x}As$ and are not doped. When $Al_xGa_{1-x}As$ is used as the first conductive layer 104b and the second conductive layer 106b, as the content of aluminum (Al) increases, light output of the nanorod light-emitting device 100 may be increased and $Al_xGa_{1-x}As$ may be easily oxidized. Also, the smaller the thickness of the first conductive layer 104b and the second conductive layer 106b, the slower the oxidation rate. Accordingly, the thickness of the first conductive layer 104b and the second conductive layer 106b and the x value of $Al_xGa_{1-x}As$ may be appropriately controlled. For example, the thickness of the first conductive layer 104b and the second conductive layer 106b may have a range from about 5 nm to about 200 nm, and x may be selected as $x \geq 0.85$.

The oxidation process of the first conductive layer 104b and the second conductive layer 106b may be performed by increasing the temperature to about 400° C. or greater while flowing DI water under an oxygen ($O_2$) atmosphere. Then, Al in $Al_xGa_{1-x}As$ is oxidized from the outermost side of the first conductive layer 104b and the second conductive layer 106b, and thus, the first current blocking layer 104a and the second current blocking layer 106a are formed. Accordingly, the first current blocking layer 104a and the second current blocking layer 106a may include an oxide material formed by oxidizing side surfaces of the first conductive layer 104b and the second conductive layer 106b. For example, the first current blocking layer 104a and the second current blocking layer 106a may include AlOx, which is an oxide of Al. The first current blocking layer 104a and the second current blocking layer 106a may also partially include components, such as Al, Ga, and As that remain without oxidation. Since AlOx has high electrical resistance, the first current blocking layer 104a and the second current blocking layer 106a may prevent current from flowing to an outer side of the light-emitting layer 105.

When the hard mask 120 remaining on the second semiconductor layer 107 or the contact layer 108 is removed in the operation illustrated in FIG. 2D, the manufacture of the nanorod light-emitting device 100 illustrated in FIG. 1 may be completed. Through the processes illustrated in FIGS. 2A to 2D, a plurality of nanorod light-emitting devices 100 may be formed at once.

Figure 2E:
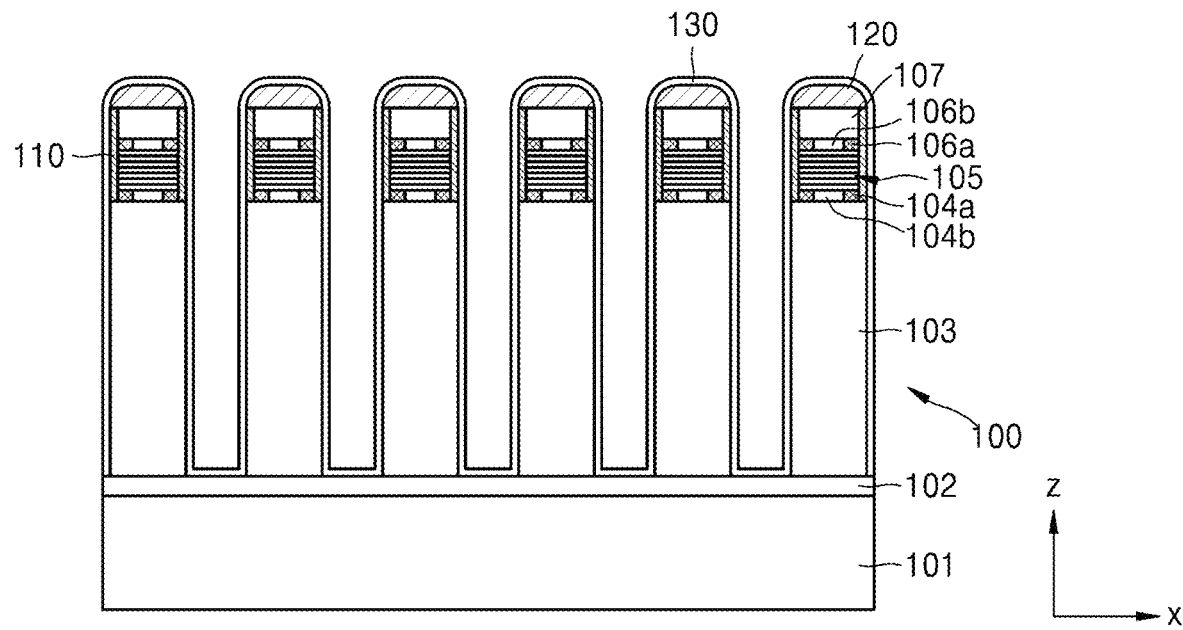
FIG. 2E is a fifth cross sectional view schematically showing the method of manufacturing the nanorod light-emitting device according to the embodiment.

However, a passivation process shown in FIG. 2E may further be performed in order to further improve the performance of the nanorod light-emitting device 100. Referring to FIG. 2E, a passivation film 130 having a predetermined thickness may be formed along surfaces of the plurality of nanorod light-emitting devices 100 and the sacrificial layer 102. Then, the first semiconductor layer 103, the first current blocking layer 104a, the light-emitting layer 105, the second current blocking layer 106a, and the second semiconductor layer 107 of each of the nanorod light-emitting devices 100 may be surrounded by the passivation film 130. The passivation film 130 may be formed by using, for example, a metal-organic chemical vapor deposition (MOCVD) method or an atomic layer deposition (ALD) method.

The passivation film 130 may include a material having a high electrical resistance and a large band gap, such as AlOx, HfOx, TiOx, SiNx, SiOx, etc. Also, the passivation film 130 may include a material capable of automatic oxidation. For example, the passivation film 130 may include $Al_xGa_{1-x}As$ (x≥0.9). As the content of x in $Al_xGa_{1-x}As$ increases, the $Al_xGa_{1-x}As$ easily oxidized. Accordingly, the passivation film 130 may be formed by selecting x as large as 0.9 or more through natural oxidization of $Al_xGa_{1-x}As$ without a special treatment process. In this case, after oxidation of $Al_xGa_{1-x}As$, the passivation film 130 mainly includes an AlOx component.

Figure 2F:
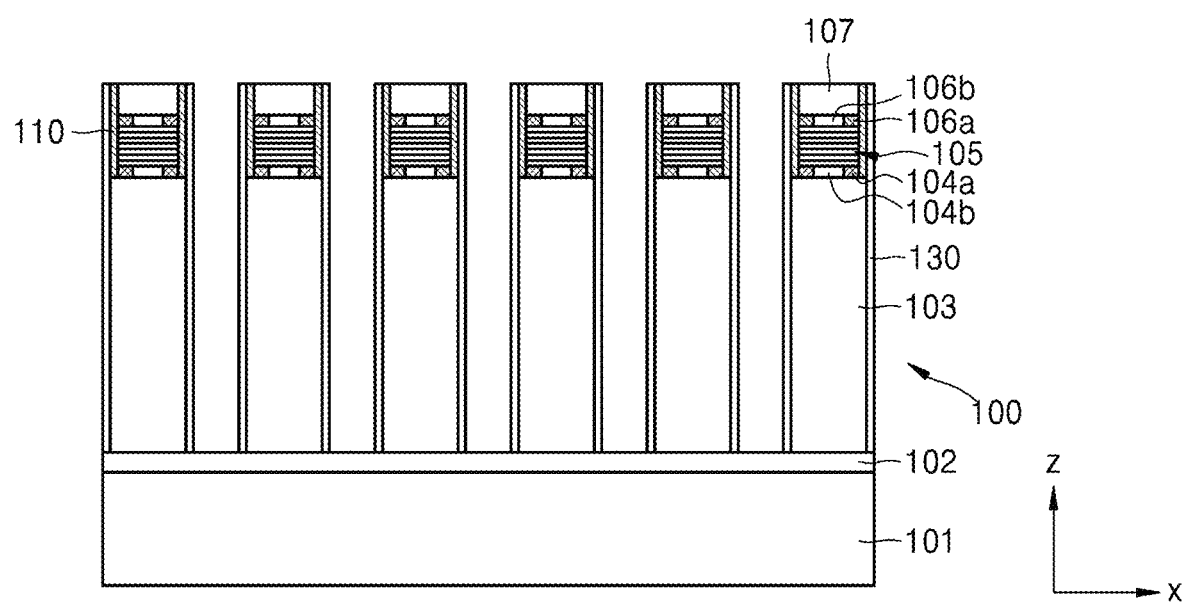
FIG. 2F is a sixth cross sectional view schematically showing the method of manufacturing the nanorod light-emitting device according to the embodiment.

Finally, referring to FIG. 2F, the material of the passivation film 130 remaining on the sacrificial layer 102 and the hard mask 120 remaining on the second semiconductor layer 107 or the contact layer 108 may be removed. Thus, a plurality of nanorod light-emitting devices 100 may be formed at once on the substrate 101 and the sacrificial layer 102. Afterwards, the plurality of nanorod light-emitting devices 100 may be individually separated by removing the sacrificial layer 102. Alternatively, each nanorod light-emitting device 100 may also be used in a state that the substrate 101 and the sacrificial layer 102 are attached thereto by cutting the substrate 101 and the sacrificial layer 102 in a vertical direction. Alternatively, two or more nanorod light-emitting devices 100 may be used together by cutting the substrate 101 and the sacrificial layer 102 in a vertical direction so that two or more nanorod light-emitting devices 100 remain.

FIGS. 4A to 4G are cross-sectional views schematically showing a method of manufacturing a nanorod light-emitting device 100 according to another embodiment. Hereinafter, a method of manufacturing the nanorod light-emitting device 100 according to another embodiment will be described with reference to FIGS. 4A to 4G.

Figure 4A:
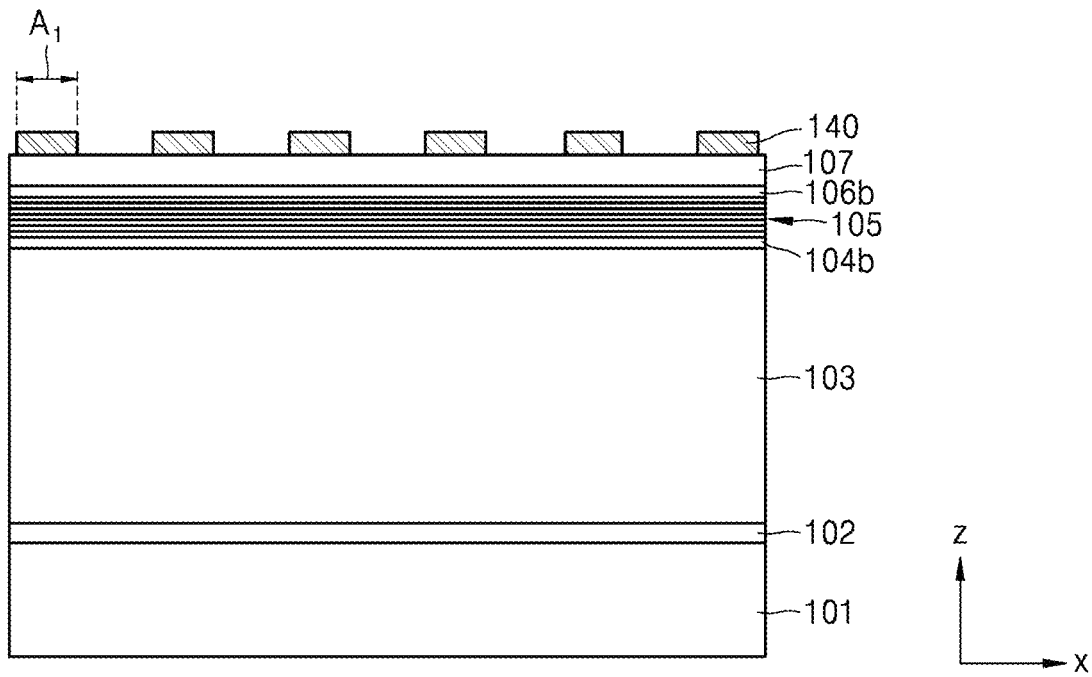
FIG. 4A is a first cross sectional view schematically showing a method of manufacturing a nanorod light-emitting device according to another embodiment.

First, referring to FIG. 4A, a process of sequentially growing a sacrificial layer 102, a first semiconductor layer 103, a first conductive layer 104b, a light-emitting layer 105, a second conductive layer 106b, and a second semiconductor layer 107 on a substrate 101 is substantially the same as that shown in FIG. 2A, and thus, the description thereof will be omitted.

After the second semiconductor layer 107 is formed, an ion implantation mask 140 is formed on the second semiconductor layer 107 at regular intervals. Alternatively, when a contact layer 108 is formed on the second semiconductor layer 107, the ion implantation mask 140 having a plurality of openings arranged at regular intervals may be formed on the contact layer 108. For example, after a material for forming the ion implantation mask 140 is formed entirely on an upper surface of the second semiconductor layer 107 or the contact layer 108, the ion implantation mask 140 may be formed by patterning the material for forming the ion implantation mask 140 so that the ion implantation mask 140 has a plurality of openings arranged at regular intervals by using a lithography method. The ion implantation mask 140 may include, for example, a $SiO_2$ single layer or a $SiO_2/Al$ double layer. Although not specified in the cross-sectional view of FIG. 4A, when viewed from the top, the ion implantation mask 140 may have a plurality of two-dimensionally arranged openings.

Figure 4B:
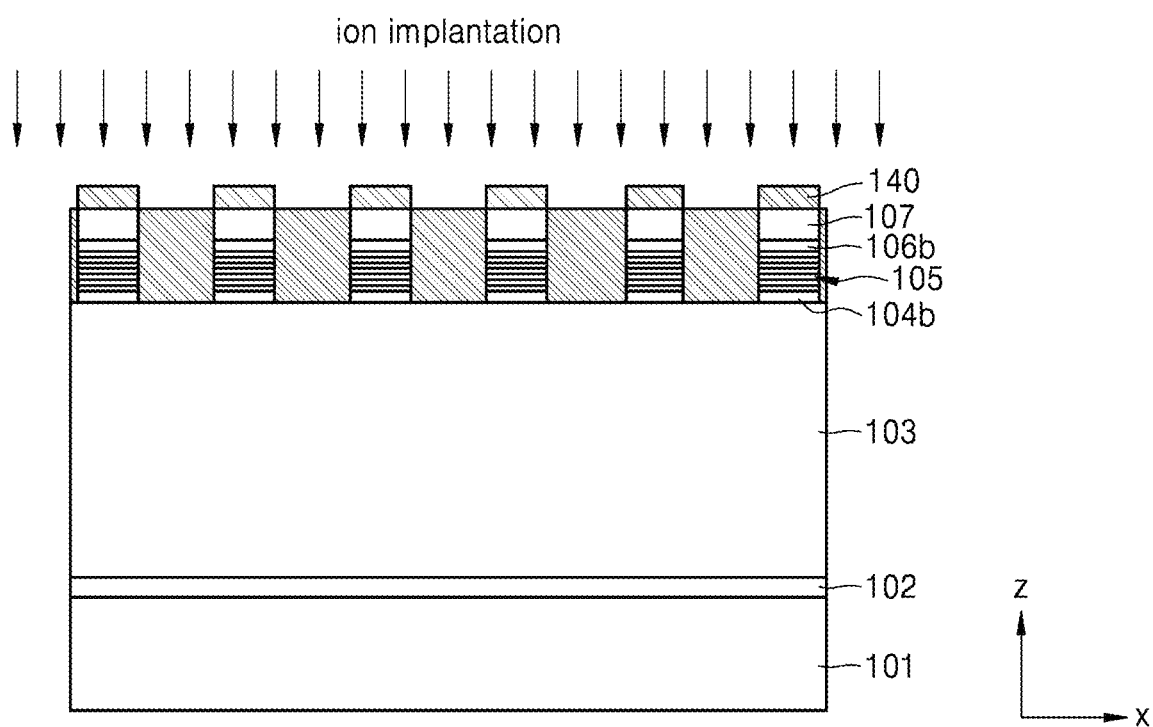
FIG. 4B is a second cross sectional view schematically showing the method of manufacturing the nanorod light-emitting device according to the another embodiment.

Referring to FIG. 4B, the insulating film 110 may be formed by implanting heavy ions into the second semiconductor layer 107, the light-emitting layer 105, and the first conductive layer 104b and the second conductive layer 106b by using an ion implantation method. In this case, a region on which ion implantation is performed may be a partial region of each of the second semiconductor layer 107, the light-emitting layer 105, and the first conductive layer 104b and the second conductive layer 106b that are not covered by the ion implantation mask 140. The ion implantation process is substantially the same as that shown in FIG. 2C, and thus, the description thereof will be omitted here.

Figure 4C:
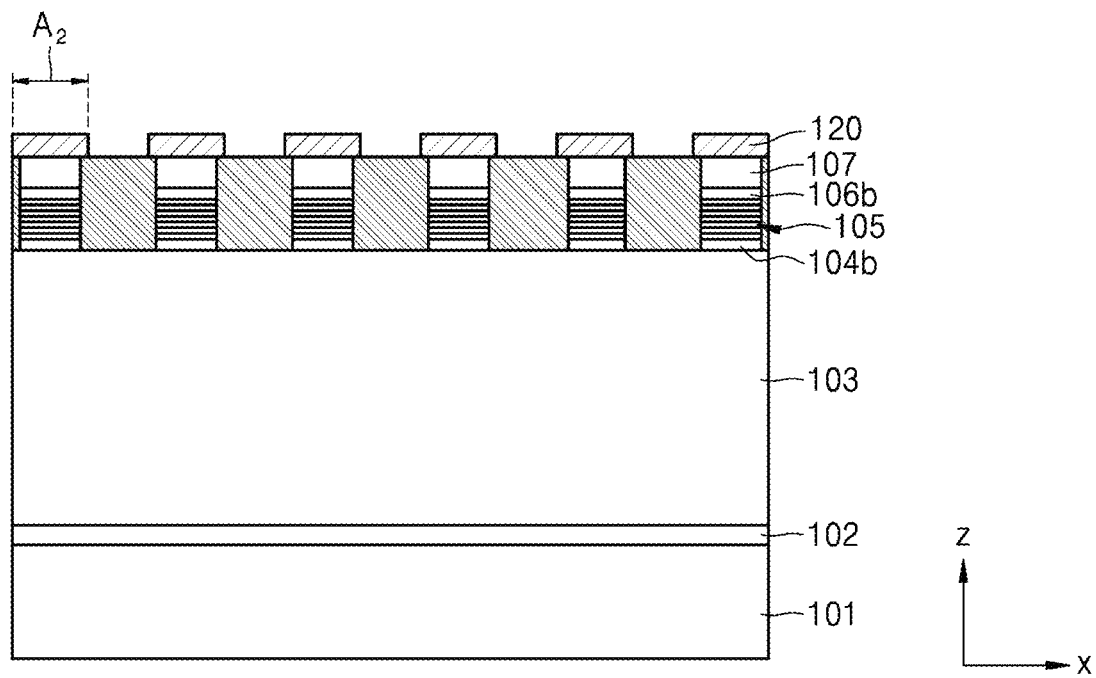
FIG. 4C is a third cross sectional view schematically showing the method of manufacturing the nanorod light-emitting device according to the another embodiment.

Referring to FIG. 4C, the ion implantation mask 140 may be removed and a hard mask 120 may be formed on the second semiconductor layer 107. A width A2 of the hard mask 120 according to an example may be greater than a width A1 of the ion implantation mask 140 shown in FIG. 4A. Accordingly, some of the insulating film 110 may not be removed during a dry etching process and may remain on side surfaces of the second semiconductor layer 107, the light-emitting layer 105, and the first conductive layer 104b and the second conductive layer 106b. The hard mask 120 may include, for example, a $SiO_2$ single layer or a $SiO_2/Al$ double layer.

Figure 4D:
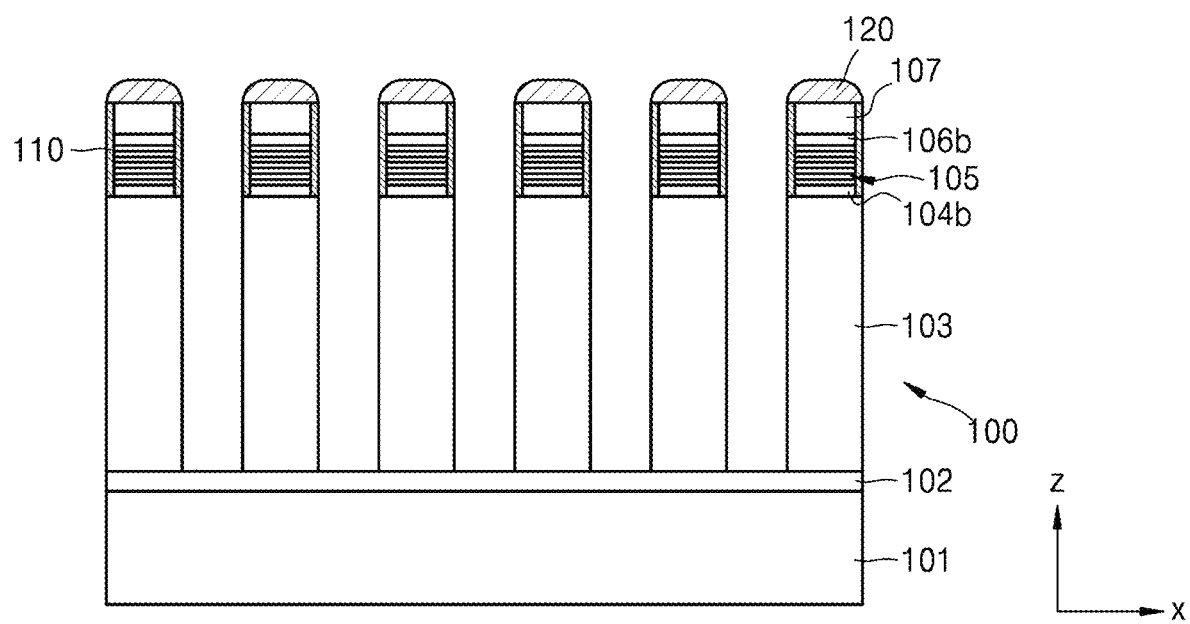
FIG. 4D is a fourth cross sectional view schematically showing the method of manufacturing the nanorod light-emitting device according to the another embodiment.

Referring to FIG. 4D, regions not covered by the hard mask 120 may be removed by dry etching. For example, some of the second semiconductor layer 107, the second conductive layer 106b, the light-emitting layer 105, the first conductive layer 104b, the first semiconductor layer 103 and the insulating film 110 under the opening of the hard mask 120 may be removed by sequentially etching them until the sacrificial layer 102 is exposed. Then, as shown in FIG. 2B, a plurality of nanorods each including the first semiconductor layer 103, the first conductive layer 104b, the light-emitting layer 105, the second conductive layer 106b, the second semiconductor layer 107, and the insulating film 110 may be formed on the substrate 101 and the sacrificial layer 102.

Figure 4E:
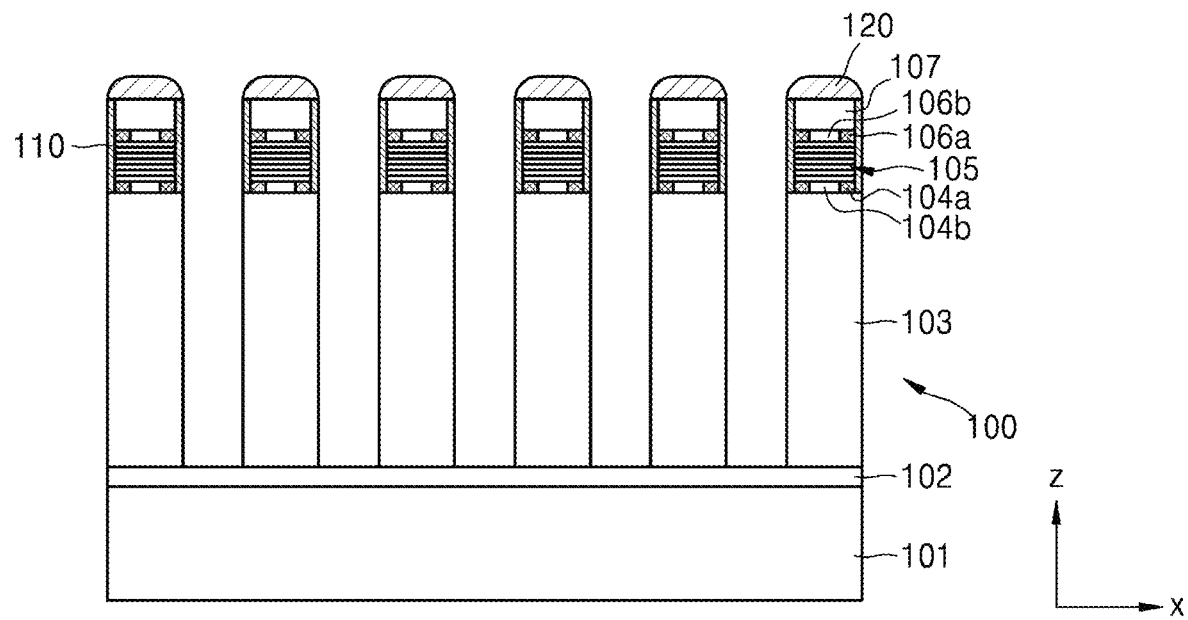
FIG. 4E is a fifth cross sectional view schematically showing the method of manufacturing the nanorod light-emitting device according to the another embodiment.

Next, referring to FIG. 4E, a first current blocking layer 104a surrounding a side surface of the first conductive layer 104b and a second current blocking layer 106a surrounding a side surface of the second conductive layer 106b may be formed by oxidizing the side surfaces of the first conductive layer 104b and the second conductive layer 106b. The process of FIG. 4E is substantially the same as the process of FIG. 2D, and thus, the description thereof will be omitted.

When the hard mask 120 remaining on the second semiconductor layer 107 or the contact layer 108 is removed in the operation illustrated in FIG. 4E, the manufacture of the nanorod light-emitting device 100 illustrated in FIG. 1 may be completed. Through the processes shown in FIGS. 4A to 4E, a plurality of nanorod light-emitting devices 100 may be formed at once.

Figure 4F:
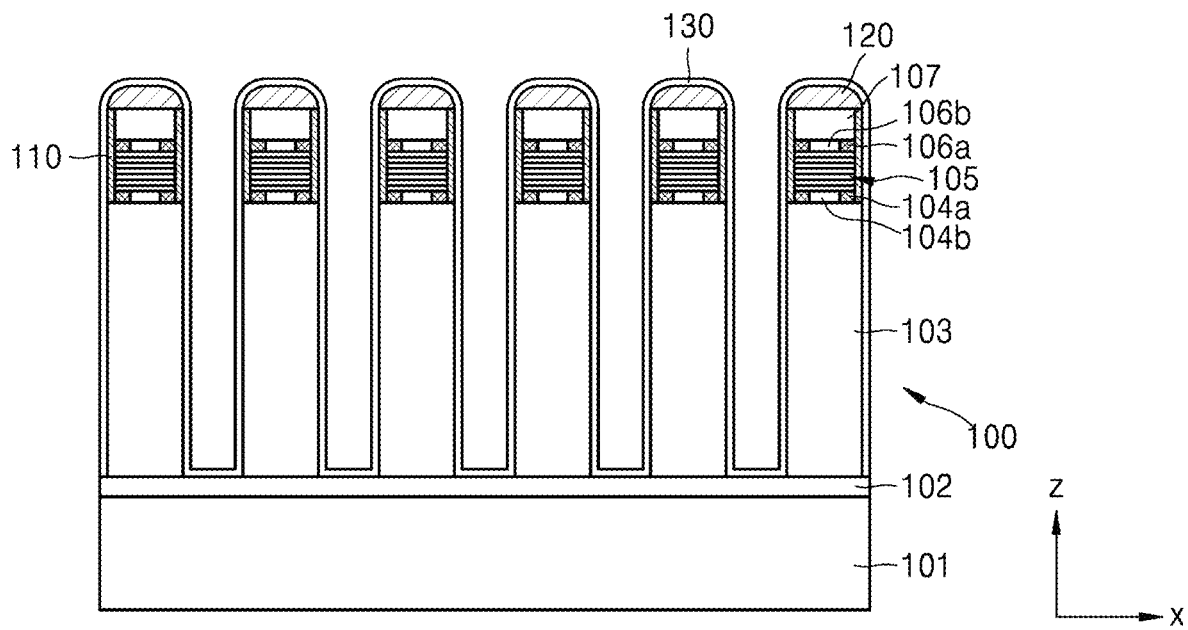
FIG. 4F is a sixth cross sectional view schematically showing the method of manufacturing the nanorod light-emitting device according to the another embodiment.

However, in order to further improve the performance of the nanorod light-emitting device 100, a passivation process shown in FIG. 4F may further be performed. Referring to FIG. 4F, a passivation film 130 having a predetermined thickness may be formed along surfaces of the plurality of nanorod light-emitting devices 100 and the sacrificial layer 102.

Figure 4G:
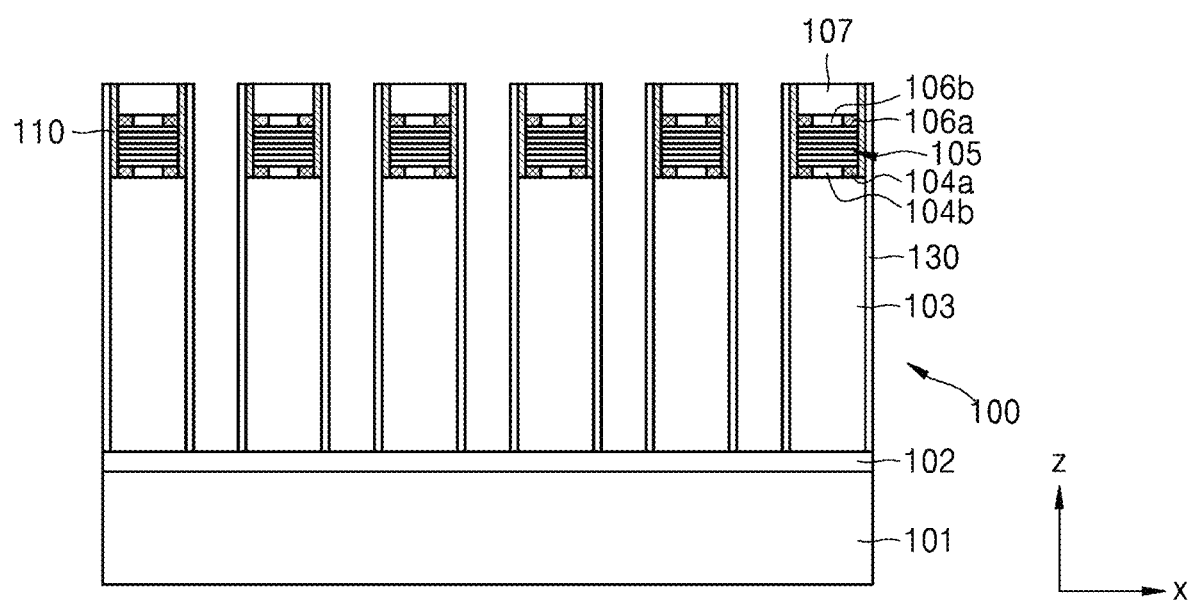
FIG. 4G is a seventh cross sectional view schematically showing the method of manufacturing the nanorod light-emitting device according to the another embodiment.

Finally, referring to FIG. 4G, the material of the passivation film 130 remaining on the sacrificial layer 102 and the hard mask 120 remaining on the second semiconductor layer 107 or the contact layer 108 may be removed. Then, a plurality of nanorod light-emitting devices 100 may be formed on the substrate 101 and the sacrificial layer 102 at once. Items related to FIGS. 4F and 4G are substantially the same as those shown in FIGS. 2E and 2F, and thus, the descriptions thereof will be omitted.

Figure 5:
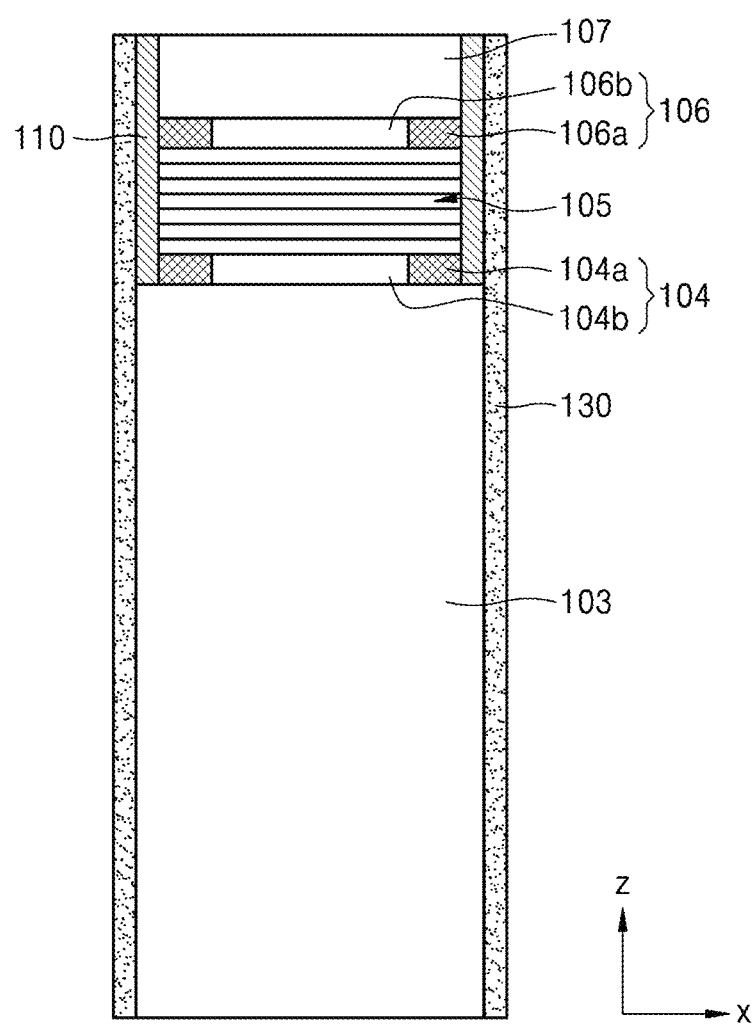
FIG. 5 is a cross-sectional view showing a schematic configuration of a nanorod light-emitting device according to an embodiment.

FIG. 5 is a cross-sectional view showing a schematic configuration of a nanorod light-emitting device 100 according to an embodiment. FIG. 6 is a cross-sectional view showing a schematic configuration of a nanorod light-emitting device 100a according to another embodiment. Referring to FIG. 5, the nanorod light-emitting device 100 may include the first semiconductor layer 103, the first current path layer 104 disposed on the first semiconductor layer 103, the light-emitting layer 105 disposed on the first current path layer 104, the second current path layer 106 disposed on the light-emitting layer 105, the second semiconductor layer 107 disposed on the second current path layer 106, and the insulating film 110 and the passivation film 130 surrounding side surfaces of the second semiconductor layer 107, the light-emitting layer 105, the first current blocking layer 104a, and the second current blocking layer 106a. Also, if necessary, a contact layer for ohmic contact may further be disposed on the lower surface of the first semiconductor layer 103 and the upper surface of the second semiconductor layer 107.

In FIG. 5, it is depicted that the insulating film 110 surrounds all side surfaces of the second semiconductor layer 107, the light-emitting layer 105, the first current blocking layer 104a, and the second current blocking layer 106a, but it is not limited thereto. For example, FIG. 6 is a cross-sectional view showing a schematic configuration of a nanorod light-emitting device 100a according to another embodiment. Referring to FIG. 6, the length $h_i$ of the insulating film 110 may extend in a length direction (Z direction) so as to also surround only a part of the first semiconductor layer 103 or all of the first semiconductor layer 103.

Also, until now, it has been described that the nanorod light-emitting device 100 and the nanorod light-emitting device 100a include the first current path layer 104 and the second current path layer 106 respectively disposed on the lower and upper surfaces of the light-emitting layer 105. However, the location and number of the current path layers are not necessarily limited thereto.

Figure 7:
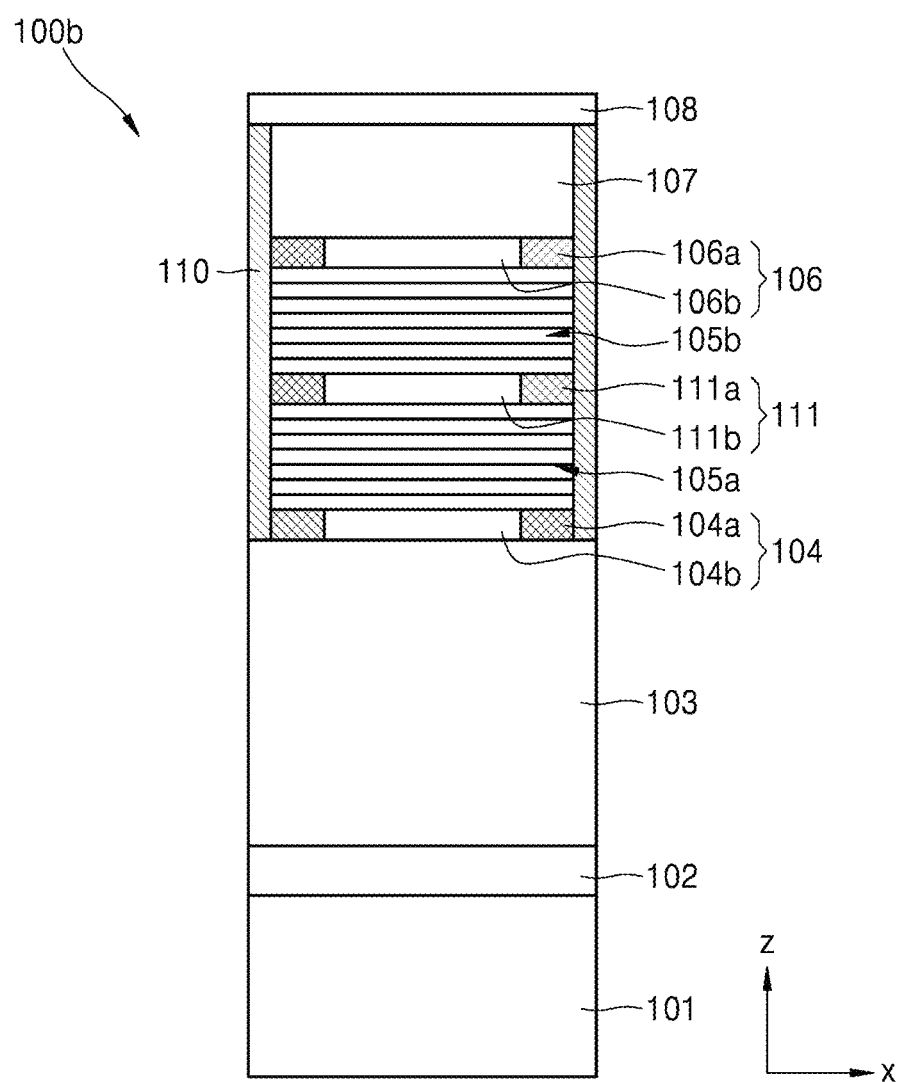
FIG. 7 is a cross sectional view showing a schematic configuration of a nanorod light-emitting device according to another embodiment.
Figure 8:
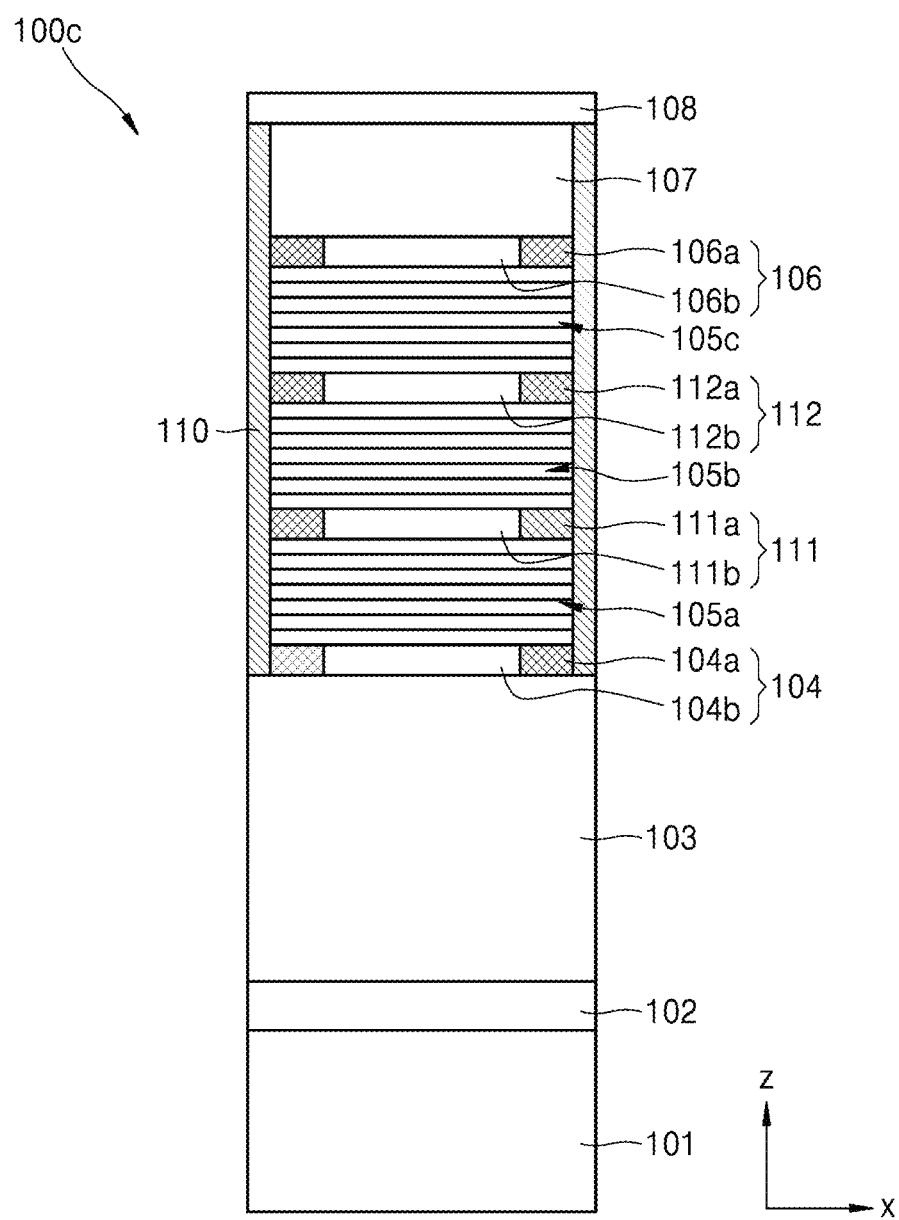
FIG. 8 is a cross sectional view showing a schematic configuration of a nanorod light-emitting device according to another embodiment.

FIGS. 7 and 8 are cross-sectional views each showing a schematic configuration of a nanorod light-emitting device according to another embodiment.

Referring to FIG. 7, a nanorod light-emitting device 100b may further include a third current path layer 111 inside the light-emitting layer 105. The light-emitting layer 105 may include a first quantum well structure 105a between a first current path layer 104 and the third current path layer 111, and a second quantum well structure 105b between the third current path layer 111 and a second current path layer 106. The second quantum well structure 105b is disposed on the first quantum well structure 105a along a thickness direction of the nanorod light-emitting device 100b.

The third current path layer 111 may include a third current blocking layer 111a at an edge between the first quantum well structure 105a and the second quantum well structure 105b, and a third conductive layer 111b in a central portion between the first quantum well structure 105a and the second quantum well structure 105b. The third current blocking layer 111a may be disposed inside the light-emitting layer 105 to surround a side surface of the third conductive layer 111b. Diameters of the first conductive layer 104b, the second conductive layer 106b, and the third conductive layer 111b may be the same. Thus, a current may be uniformly concentrated in the central portion of the light-emitting layer 105 in an entire area of the light-emitting layer 105.

Also, the insulating film 110 may be arranged to surround all side surfaces of the second semiconductor layer 107, the first quantum well structure 105a, the second quantum well structure 105b, the first current blocking layer 104a, and the second current blocking layer 106a. Accordingly, a current that has passed through the first conductive layer 104b, the second conductive layer 106b, and the third conductive layer 111b may be prevented from being spread along sides of the first quantum well structure 105a and the second quantum well structure 105b where surface defects are generated.

Also, referring to FIG. 8, a nanorod light-emitting device 100c may further include a third current path layer 111 and a fourth current path layer 112 inside the light-emitting layer 105. The light-emitting layer 105 may include a first quantum well structure 105a between the first current path layer 104 and the third current path layer 111, a second quantum well structure 105b between the third current path layer 111 and the fourth current path layer 112, and a third quantum well structure 105c between the fourth current path layer 112 and the second current path layer 106. The first quantum well structure 105a, the second quantum well structure 105b, and the third quantum well structure 105c may be sequentially stacked in a thickness direction of the nanorod light-emitting device 100c.

The third current path layer 111 may include a third current blocking layer 111a at an edge between the first quantum well structure 105a and the second quantum well structure 105b, and a third conductive layer 111b in a central portion between the first quantum well structure 105a and the second quantum well structure 105b. The fourth current path layer 112 may include a fourth current blocking layer 112a at an edge between the second quantum well structure 105b and the third quantum well structure 105c, and a fourth conductive layer 112b in a central portion between the second quantum well structure 105b and the third quantum well structure 105c. The third current blocking layer 111a may be arranged to surround a side surface of the third conductive layer 111b, and the fourth current blocking layer 112a may be arranged to surround a side surface of the fourth conductive layer 112b.

Also, the insulating film 110 may be arranged to surround all side surfaces of the second semiconductor layer 107, the first quantum well structure 105a, the second quantum well structure 105b, the third quantum well structure 105c, the first current blocking layer 104a, the second current blocking layer 106a, the third current blocking layer 111a, and the fourth current blocking layer 112a. Accordingly, a current that has passed through the first conductive layer 104b, the second conductive layer 106b, the third conductive layer 111b, and the fourth conductive layer 112b may be prevented from being spread along sides of the first quantum well structure 105a and the second quantum well structure 105b where surface defects are generated.

As the number of quantum wells in the light-emitting layer 105 increases, a current path layer may further be added in this manner. For example, as the number of quantum wells in the light-emitting layer 105 increases, a plurality of MQW structures and a plurality of current path layers may be alternately disposed in the light-emitting layer 105. In this case, one multi-quantum well structure disposed between the two current path layers may include, for example, 1 to about 10 quantum wells. In this case, the current passing through the conductive layer may be spread along sides of the plurality of MQWs in which surface defects have occurred. In this case, the insulating film 110 may increase luminous efficiency by preventing a phenomenon in which a current is spread along sides of the plurality of MQWs where surface defects have occurred.

The nanorod light-emitting device 100 according to an embodiment may be applied in various ways. In particular, the nanorod light-emitting device 100 may be used as a light-emitting element of pixels of a next-generation display device.

Figure 9:
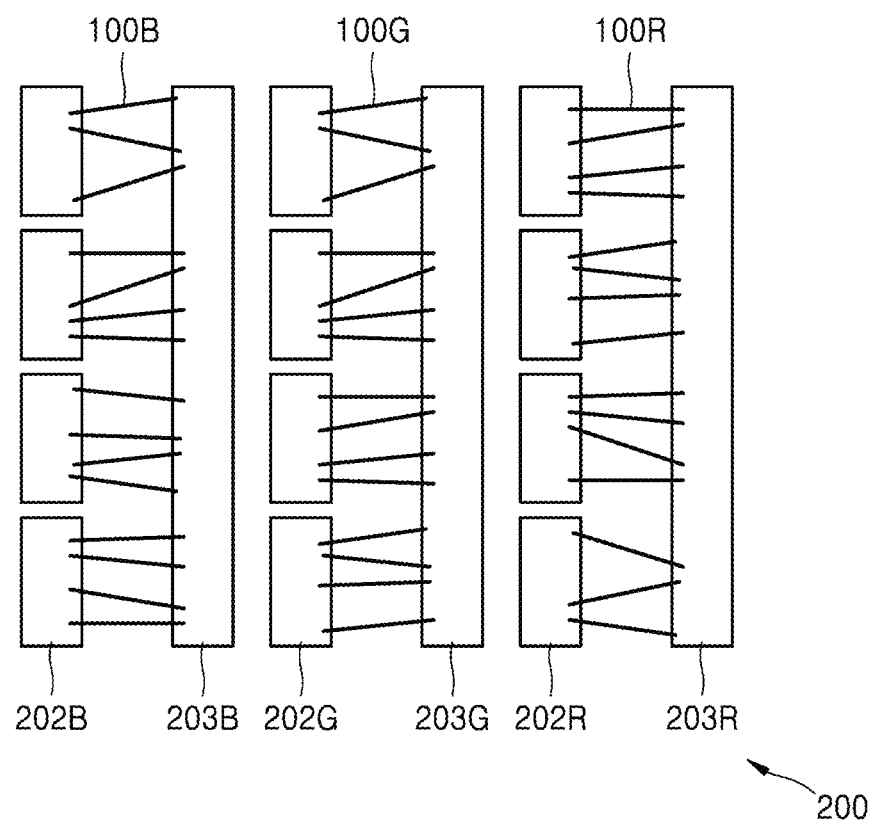
FIG. 9 is a conceptual diagram schematically showing a configuration of a display device using a nanorod light-emitting device according to an embodiment.

FIG. 9 is a conceptual diagram schematically showing a configuration of a display device 200 using the nanorod light-emitting device 100 according to an embodiment. Referring to FIG. 9, the display device 200 may include a plurality of first pixel electrodes 202B, a first common electrode 203B corresponding to the plurality of first pixel electrodes 202B, a plurality of second pixel electrodes 202G, a second common electrode 203G corresponding to the plurality of second pixel electrodes 202G, a plurality of third pixel electrodes 202R, and a third common electrode 203R corresponding to the plurality of third pixel electrodes 202R, a plurality of a first nanorod light-emitting device 100B connected between each of the first pixel electrodes 202B and the first common electrode 203B, a plurality of a second nanorod light-emitting device 100G connected between each of the second pixel electrodes 202G and the second common electrode 203G, and a plurality of a third nanorod light-emitting device 100R connected between each of the third pixel electrodes 202R and the third common electrode 203R.

For example, the first nanorod light-emitting device 100B may be configured to emit blue light, the second nanorod light-emitting device 100G may be configured to emit green light, and the third nanorod light-emitting device 100R may be configured to emit red light. Also, one of the first pixel electrodes 202B may constitute one blue sub-pixel together with the first common electrode 203B, one of the second pixel electrodes 202G may constitute one green sub-pixel together with the second common electrode 203G, and one of the third pixel electrodes 202R may constitute one red sub-pixel together with the third common electrode 203R.

Figure 10:
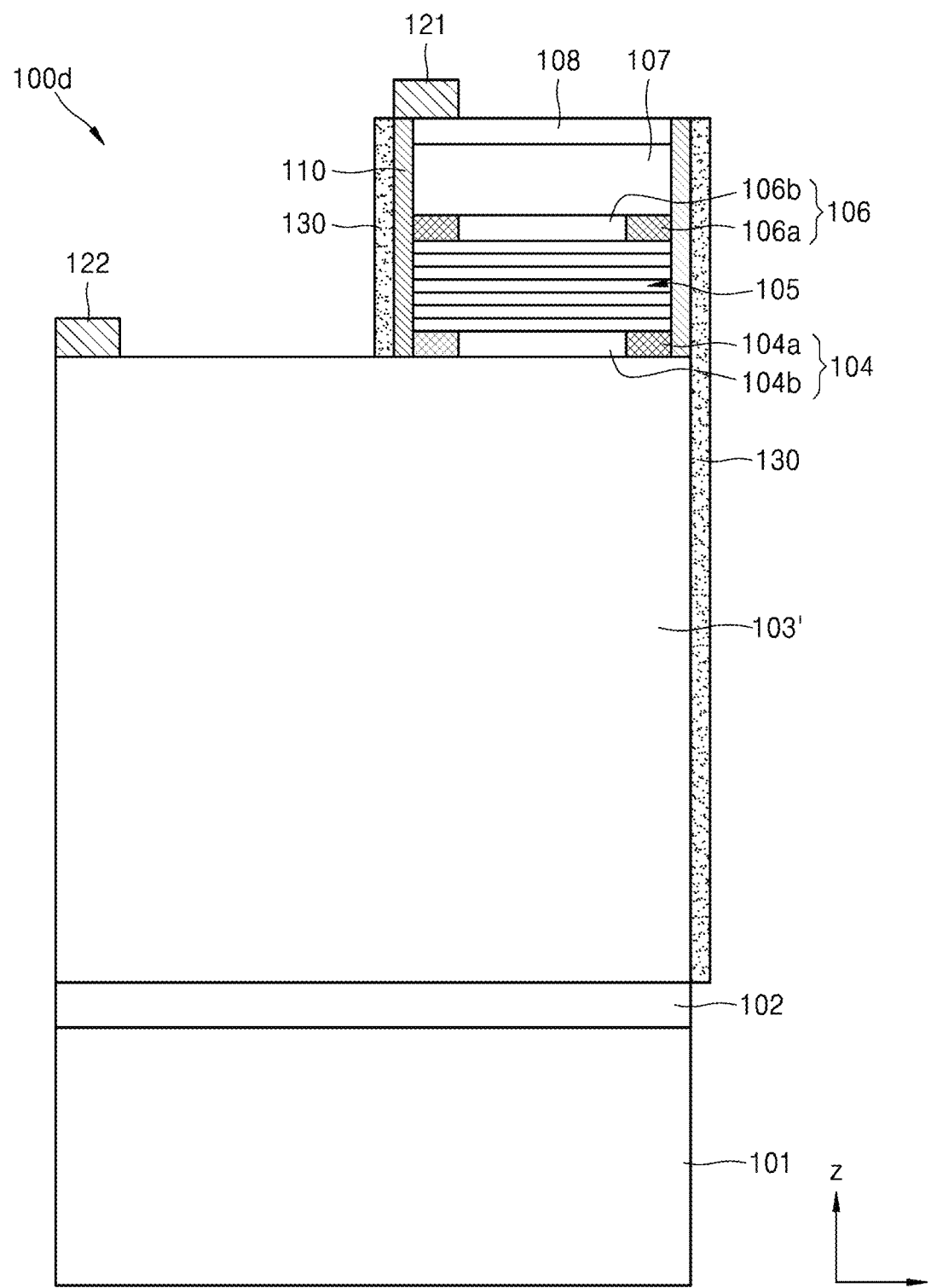
FIG. 10 is a cross-sectional view showing a schematic configuration of a nanorod light-emitting device according to another embodiment.

FIG. 10 is a cross-sectional view showing a schematic configuration of a nanorod light-emitting device 100d according to another embodiment. Referring to FIG. 10, the nanorod light-emitting device 100d according to another embodiment includes a substrate 101, a sacrificial layer 102, a first semiconductor layer 103', a first current path layer 104, a light-emitting layer 105, a second current path layer 106, a second semiconductor layer 107, a contact layer 108, an insulating film 110, and a passivation film 130. The first current path layer 104 may include a first current blocking layer 104a and a first conductive layer 104b, and the second current path layer 106 may include a second current blocking layer 106a and a second conductive layer.

In the nanorod light-emitting device 100d illustrated in FIG. 10, the substrate 101, the sacrificial layer 102, and the first semiconductor layer 103' have a width or diameter greater than that of other layers. In other words, the first current path layer 104, the light-emitting layer 105, the second current path layer 106, the second semiconductor layer 107, and the contact layer 108 have a width or diameter less than that of the substrate 101, the sacrificial layer 102, and the first semiconductor layer 103'. For example, the contact layer 108, the second semiconductor layer 107, the second current path layer 106, and the light-emitting layer 105, and the first current path layer 104 may be partially etched and removed so that a portion of an upper surface of the first semiconductor layer 103' is exposed. A first electrode 122 may further be disposed on the exposed upper surface of the first semiconductor layer 103', and a second electrode 121 may further be disposed on an upper surface of the contact layer 108.

As shown in FIG. 10, first sides of the substrate 101, the sacrificial layer 102, the first semiconductor layer 103', the first current path layer 104, the light-emitting layer 105, the second current path layer 106, the second semiconductor layer 107, and the contact layer 108 may be located on the same plane in the vertical direction. In addition, second sides of the substrate 101, the sacrificial layer 102, and the first semiconductor layer 103' on opposite sides to the first sides may protrude further in the horizontal direction than second sides of the first current path layer 104, the light-emitting layer 105, and the second current path layer 106, the second semiconductor layer 107, and the contact layer 108.

In this case, the insulating film 110 may be arranged to surround the first sides of the first semiconductor layer 103', the first current path layer 104, the light-emitting layer 105, the second current path layer 106, the second semiconductor layer 107, and the contact layer 108. According to an embodiment, with reference to FIG. 6, the insulating film 110 may be arranged to also surround at least a part of the first semiconductor layer 103'.

Also, the passivation film 130 may be arranged to surround the first sides of the first semiconductor layer 103', the first current path layer 104, the light-emitting layer 105, the second current path layer 106, the second semiconductor layer 107, and the contact layer 108, and to surround the second sides the first current path layer 104, the light-emitting layer 105, the second current path layer 106, the second semiconductor layer 107, and the contact layer 108.

Figure 11:
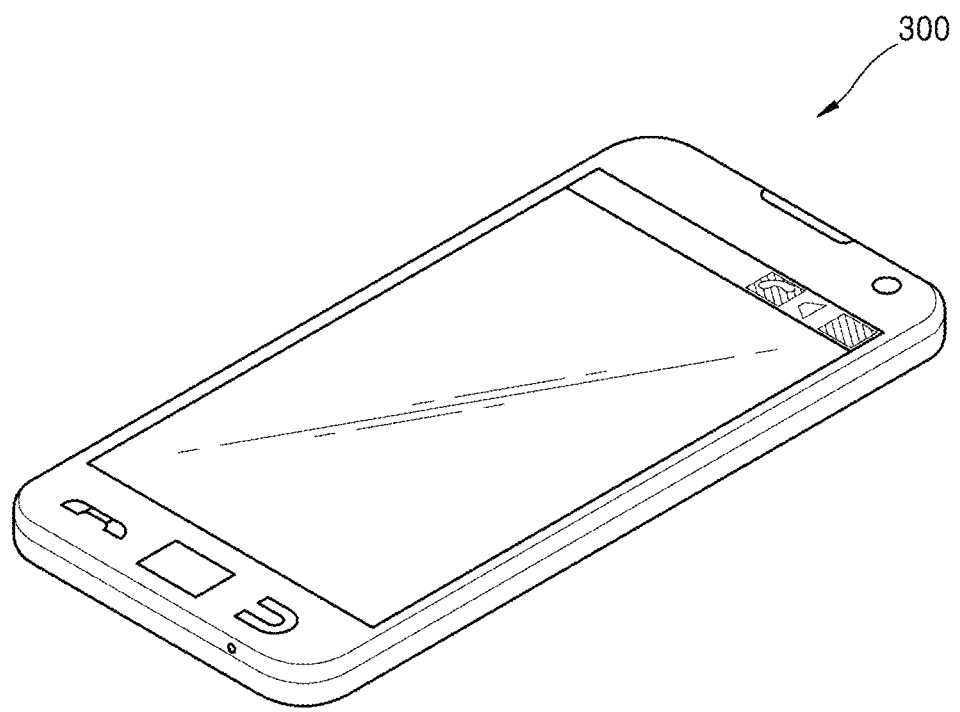
FIG. 11 is a diagram illustrating a display device to which nanorod light-emitting devices according to an embodiment are applied.

The nanorod light-emitting devices according to the embodiments described above may be applied to display devices of various sizes and uses without limitation. FIG. 11 is a diagram illustrating a display device to which nanorod light-emitting devices according to the embodiments are applied. As shown in FIG. 11, the nanorod light-emitting device may be applied to a display panel of a mobile phone or smart phone 300. However, embodiments of the present disclosure are not limited thereto, and the nanorod light-emitting device according to an embodiment may be applied to a display panel of a tablet or a smart tablet, or may be applied to a display panel of a notebook computer. Also, the nanorod light-emitting device according to an embodiment may be applied to: a display panel of a television or a smart television; a small display panel in a head mounted display (HMD), a glasses-type display, or a goggle-type display, etc.; or a large display panel used in signage, large billboards, theater screens, etc.

According to embodiments of the present disclosure, a current may be concentrated to a central portion of a nanorod having relatively few defects by preventing current from flowing to a side of the nanorod having surface defects.

According to embodiments of the present disclosure, luminous efficiency of the nanorod light-emitting device may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A nanorod light-emitting device comprising:
a first semiconductor layer doped with a first conductivity type;
a light-emitting layer on the first semiconductor layer;
a second semiconductor layer disposed on the light-emitting layer and doped with a second conductivity type that is electrically opposite to the first conductivity type;
at least one conductive layer disposed between a central portion of a lower surface of the light-emitting layer and the first semiconductor layer, or between a central portion of an upper surface of the light-emitting layer and the second semiconductor layer;
at least one current blocking layer that surrounds a side surface of the at least one conductive layer; and
an insulating film that surrounds a side surface of the second semiconductor layer, a side surface of the light-emitting layer, and a side surface of the at least one current blocking layer,
wherein a diameter of the first semiconductor layer of the nanorod light-emitting device and an outer diameter of the insulating film of the nanorod light-emitting device are both in a range of 0.05 µm to 2 µm, and
wherein an upper surface of the first semiconductor layer contacts a lower surface of the insulating film.

2. The nanorod light-emitting device of claim 1, wherein the insulating film comprises implanted heavy ions.

3. The nanorod light-emitting device of claim 2, wherein the implanted heavy ions include one or more from among Ar, As, Kr, and Xe.

4. The nanorod light-emitting device of claim 1, wherein the insulating film extends to the first semiconductor layer and surrounds a side surface of the first semiconductor layer.

5. The nanorod light-emitting device of claim 1, wherein the first semiconductor layer is a single layer comprising a semiconductor material of a single composition.

6. The nanorod light-emitting device of claim 5, wherein the second semiconductor layer is a single layer comprising a semiconductor material having a same composition as the semiconductor material of the first semiconductor layer.

7. The nanorod light-emitting device of claim 1, wherein the at least one current blocking layer comprises an oxide material.

8. The nanorod light-emitting device of claim 1, wherein the at least one conductive layer is a plurality of conductive layers that comprise a first conductive layer between the central portion of the lower surface of the light-emitting layer and the first semiconductor layer, and a second conductive layer between the central portion of the upper surface of the light-emitting layer and the second semiconductor layer.

9. The nanorod light-emitting device of claim 8, wherein the at least one current blocking layer is a plurality of current blocking layers that comprise a first current blocking layer that surrounds a side of the first conductive layer, and a second current blocking layer that surrounds a side of the second conductive layer.

10. The nanorod light-emitting device of claim 9, wherein the insulating film extends to an upper surface of the first current blocking layer such as to surround the side surface of the second semiconductor layer, the side surface of the second current blocking layer, and the side surface of the light-emitting layer.

11. The nanorod light-emitting device of claim 9, wherein the plurality of conductive layers further comprises a third conductive layer disposed in the light-emitting layer at a central portion of the light-emitting layer, and the plurality of current blocking layers further comprises a third current blocking layer that surrounds a side surface of the third conductive layer in the light-emitting layer.

12. The nanorod light-emitting device of claim 11, wherein
the light-emitting layer comprises a first quantum well structure and a second quantum well structure, and
the third conductive layer is disposed at the central portion, between the first quantum well structure and the second quantum well structure, and the third current blocking layer is disposed at an edge between the first quantum well structure and the second quantum well structure.

13. The nanorod light-emitting device of claim 1, further comprising a contact layer disposed on an upper surface of the second semiconductor layer.

14. The nanorod light-emitting device of claim 1, wherein the diameter of the first semiconductor layer of the nanorod light-emitting device is equal to the outer diameter of the insulating film of the nanorod light-emitting device.

15. The nanorod light-emitting device of claim 14, wherein each of the at least one conductive layer has a diameter of 0.01 µm or more and is less than the outer diameter of the insulating film.

16. The nanorod light-emitting device of claim 1, wherein the nanorod light-emitting device has a height in a range of 1 µm to 20 µm.

17. The nanorod light-emitting device of claim 1, wherein each of the at least one current blocking layer and the at least one conductive layer have a same thickness.

18. The nanorod light-emitting device of claim 17, wherein each of the at least one current blocking layer has a thickness in a range of 5 nm to 200 nm.

19. The nanorod light-emitting device of claim 1, wherein the at least one conductive layer comprises $Al_xGa_{1-x}As$ (x≥0.85), the at least one current blocking layer comprises AlOx, and the first semiconductor layer and the second semiconductor layer comprise AlGaInP.

20. The nanorod light-emitting device of claim 1, further comprising a passivation film surrounding a side surface of the insulating film and a side surface of the first semiconductor layer.

21. The nanorod light-emitting device of claim 20, wherein the passivation film comprises at least one material selected from AlOx, HfOx, TiOx, SiNx, SiOx, and $Al_xGa_{1-x}As$ (x≥0.9).

22. A display device comprising:
a plurality of pixel electrodes;

a common electrode corresponding to the plurality of pixel electrodes; and
a plurality of nanorod light-emitting devices connected between each of the pixel electrodes and the common electrode, wherein
each of the plurality of nanorod light-emitting devices is the nanorod light-emitting device according to claim 1.

* * * * *